United States Patent
Lee et al.

(10) Patent No.: US 11,195,456 B2
(45) Date of Patent: Dec. 7, 2021

(54) DISPLAY DEVICE WITH A REDUCED DEAD SPACE

(71) Applicant: Samsung Display Co., Ltd., Yongin-Si (KR)

(72) Inventors: Jung Kyu Lee, Incheon (KR); Seung Hwan Cho, Yongin-si (KR); Min Joo Kim, Bucheon-si (KR); Tae Hyun Kim, Seoul (KR); Dong Hwan Shim, Hwaseong-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/841,605

(22) Filed: Apr. 6, 2020

(65) Prior Publication Data

US 2021/0082343 A1 Mar. 18, 2021

(30) Foreign Application Priority Data

Sep. 17, 2019 (KR) .................. 10-2019-0114355

(51) Int. Cl.
*G09G 3/3225* (2016.01)
*H01L 27/32* (2006.01)
(Continued)

(52) U.S. Cl.
CPC ......... *G09G 3/3225* (2013.01); *H01L 27/323* (2013.01); *H01L 27/3262* (2013.01);
(Continued)

(58) Field of Classification Search
CPC ......... G09G 3/3225; G09G 2310/0297; G09G 2300/0426; G09G 2310/0243;
(Continued)

(56) References Cited

U.S. PATENT DOCUMENTS 8,637,894 B2 * 1/2014 Lee .................. H01L 27/3276
257/99
9,741,278 B2 * 8/2017 Kang .................. G09G 3/3225
(Continued)

FOREIGN PATENT DOCUMENTS

JP 2018141985 A 9/2018

OTHER PUBLICATIONS

European Communication corresponding to European Patent Application No. 20183527.9 dated Nov. 27, 2020 7 pages.

*Primary Examiner* — Vinh T Lam
(74) *Attorney, Agent, or Firm* — Innovation Counsel LLP

(57) ABSTRACT

A display device includes: a display area and a non-display area positioned around the display area and including a pad portion and a contact portion that is disposed between the display area and the pad portion; a first circuit portion including an embedded circuit disposed in the display area, a first connection electrode disposed in the pad portion, and a second connection electrode disposed in the contact portion; and a second circuit portion disposed on a layer different from the first circuit portion and including a pixel disposed in the display area, a pad disposed in the pad portion, and a data line extending across the contact portion and the display area and electrically connected to the pixel. The pad is electrically connected to the embedded circuit through the first connection electrode. The data line is electrically connected to the embedded circuit via the second connection electrode.

22 Claims, 23 Drawing Sheets

(51) Int. Cl.
*H01L 27/12* (2006.01)
*H01L 29/786* (2006.01)

(52) U.S. Cl.
CPC . *H01L 27/3276* (2013.01); *G09G 2300/0426* (2013.01); *G09G 2310/0243* (2013.01); *G09G 2310/0297* (2013.01); *H01L 27/124* (2013.01); *H01L 27/1225* (2013.01); *H01L 27/1251* (2013.01); *H01L 27/1255* (2013.01); *H01L 29/7869* (2013.01); *H01L 29/78675* (2013.01)

(58) Field of Classification Search
CPC ............ H01L 27/3262; H01L 27/3276; H01L 27/323; H01L 27/1225; H01L 27/124; H01L 29/7869; H01L 27/1251; H01L 27/1255; H01L 29/78675
See application file for complete search history.

(56) References Cited

U.S. PATENT DOCUMENTS

| | | | |
|---|---|---|---|
| 10,175,843 B2 * | 1/2019 | Kwak | H01L 27/323 |
| 10,186,206 B2 * | 1/2019 | Sung | G09G 3/3291 |
| 10,234,982 B2 * | 3/2019 | Na | G06F 3/0412 |
| 10,418,425 B2 * | 9/2019 | Park | G06F 3/0446 |
| 10,617,005 B2 * | 4/2020 | Lee | H05K 3/365 |
| 10,698,523 B2 * | 6/2020 | Jang | H01L 27/3276 |
| 10,811,482 B2 * | 10/2020 | Kim | G06F 3/04164 |
| 2012/0074408 A1 * | 3/2012 | Moon | H01L 27/3262 257/57 |
| 2013/0140559 A1 * | 6/2013 | Yamazaki | H01L 29/7869 257/43 |
| 2015/0077953 A1 * | 3/2015 | Namkung | H05K 3/28 361/751 |
| 2015/0138041 A1 | 5/2015 | Hirakata et al. | |
| 2015/0243220 A1 | 8/2015 | Kim et al. | |
| 2018/0139312 A1 * | 5/2018 | Yamazaki | H01L 51/5237 |
| 2018/0197484 A1 * | 7/2018 | Moon | H01L 27/3248 |
| 2019/0180671 A1 * | 6/2019 | Cheng | G11C 19/28 |
| 2019/0181211 A1 * | 6/2019 | Bae | H01L 51/0097 |
| 2019/0213952 A1 | 7/2019 | Park | |
| 2019/0304374 A1 * | 10/2019 | Wang | H01L 27/3276 |
| 2020/0066198 A1 * | 2/2020 | Park | H01L 23/60 |
| 2020/0081304 A1 * | 3/2020 | Wang | G02F 1/136286 |
| 2020/0106050 A1 * | 4/2020 | Jeong | H01L 51/5256 |
| 2020/0118506 A1 * | 4/2020 | Yamamoto | G09G 3/3685 |
| 2020/0159054 A1 * | 5/2020 | Jeong | G02B 6/0068 |
| 2020/0184871 A1 * | 6/2020 | Hong | G09G 3/3275 |
| 2020/0211489 A1 * | 7/2020 | Yamamoto | G09G 3/3688 |
| 2020/0243568 A1 * | 7/2020 | Oda | H01L 21/3115 |
| 2020/0380903 A1 * | 12/2020 | Dong | G09G 3/3225 |

* cited by examiner

DL: DLa, DLb

DISPLAY DEVICE WITH A REDUCED DEAD SPACE

This application claims priority to Korean Patent Application No. 10-2019-0114355 filed on Sep. 17, 2019 in the Korean Intellectual Property Office, the disclosure of which is incorporated herein by reference in its entirety.

BACKGROUND

1. Field of the Disclosure

The present disclosure relates to a display device, more particularly, to a display device with a reduced dead space.

2. Description of the Related Art

Display devices become increasingly important as multimedia technology evolves. Varies types of display devices such as liquid-crystal display (LCD) devices and organic light-emitting display (OLED) devices are currently used. Among them, an OLED device including an organic light-emitting element that emits light on its own exhibits an excellent contrast ratio and a wide viewing angle. Due to its advantages, OLED devices are attracting attention as the next generation display device.

The display device may include a display area and a non-display area that is disposed around the display area. Pixel circuits may be disposed in the display area, whereas a variety of driving circuits for driving the pixel circuits may be disposed in the non-display area, which is a dead space of the display device. Recently, display devices having a wider display surface in a limited size, for example, having a narrower bezel, have been preferred. To this end, research has been put into developing ways to reduce the dead space. Unfortunately, as the resolution of display devices increases, the driving circuits become more complicated, and thus it is more difficult to reduce the area where the driving circuits are disposed. Therefore, there is a limit in reducing a width of the non-display area where the driving circuits are disposed.

SUMMARY

Exemplary embodiments of the present disclosure provide a display device with a reduced dead space.

It should be noted that objects of the present disclosure are not limited to the exemplary embodiments disclosed herein; and other objects of the present disclosure will be apparent to those skilled in the art from the following descriptions on a window.

According to an embodiment, a display device includes: a display area and a non-display area positioned around the display area, the non-display area including a pad portion and a contact portion that is disposed between the display area and the pad portion; a first circuit portion including an embedded circuit disposed in the display area, a first connection electrode disposed in the pad portion, and a second connection electrode disposed in the contact portion; and a second circuit portion disposed on a layer different from the first circuit portion and including a pixel disposed in the display area, a pad disposed in the pad portion, and a data line extending across the contact portion and the display area and electrically connected to the pixel. The pad is electrically connected to the embedded circuit through the first connection electrode. The data line is electrically connected to the embedded circuit via the second connection electrode.

The display device may further include: a first fan-out line connecting the first connection electrode and the embedded circuit; and a second fan-out line connecting the embedded circuit and the second connection electrode, wherein the first fan-out line may extend across the pad portion, the contact portion, and the display area, and the second fan-out line may extend across the display area and the contact portion.

The first connection electrode and the second connection electrode may be disposed on a first same layer and include a first same material, and the pad and the line may be disposed on a second same layer and may include a second same material.

The first fan-out line and the second fan-out line may be disposed on a same layer and may include a same material, and the same layer on which the first fan-out line and the second fan-out line are disposed may be different from another layer on which the first connection electrode is disposed.

The pixel may include a pixel transistor and a light-emitting element electrically connected to the pixel transistor, and the embedded circuit may include an embedded circuit transistor.

The pixel transistor may include a pixel semiconductor layer, and the embedded circuit transistor may include an embedded circuit semiconductor layer, and the pixel semiconductor layer and the embedded circuit semiconductor layer may include different materials.

One of the embedded circuit semiconductor layer and the pixel semiconductor layer may include an oxide semiconductor, and the other of the embedded circuit semiconductor layer and the pixel semiconductor layer may include a polysilicon.

The pixel transistor may include a pixel semiconductor layer, a pixel gate electrode disposed on the pixel semiconductor layer, and a pixel source electrode and a pixel drain electrode disposed on the pixel gate electrode, and the pixel source electrode and the pixel drain electrode may be electrically connected to the pixel semiconductor layer, and the pixel source electrode and the pixel drain electrode are disposed on a same layer as the pad.

The embedded circuit transistor may include an embedded circuit semiconductor layer, an embedded circuit gate electrode disposed on the embedded circuit semiconductor layer, and an embedded circuit source electrode and an embedded circuit drain electrode disposed on the embedded circuit gate electrode, and the embedded circuit source electrode and the embedded circuit drain electrode may be disposed on a same layer as the first connection electrode.

The second connection electrode may be closer to the display area than the first connection electrode when viewed from top in a plan view.

The display device may further include: an interlayer dielectric layer disposed between the first circuit portion and the second circuit portion.

The interlayer dielectric layer may be in direct contact with the first connection electrode and the second connection electrode.

According to an embodiment, a display device includes: a display area and a non-display area positioned around the display area, the non-display area including a pad portion and a contact portion that is disposed between the display area and the pad portion; a first circuit portion including a demultiplexer disposed in the display area, a first connection electrode disposed in the pad portion, and a second connection electrode disposed in the contact portion; and a second circuit portion disposed on a layer different from the first circuit portion and including a pixel disposed in the display area, a pad disposed in the pad portion, and at least one data line extending across the contact portion and the display area and electrically connected to the pixel, wherein the pad is electrically connected to the demultiplexer through the first connection electrode and provides a data signal to the demultiplexer, wherein the at least one data line is electrically connected to the demultiplexer via the second connection electrode, and the demultiplexer generates divided data signals by dividing the data signal received from the pad using a time-division multiplexing.

The at least one data line may include a first data line and a second data line that provide the divided data signals, respectively.

The second connection electrode may include a (2-1) connection electrode connecting the demultiplexer and the first data line, and a (2-2) connection electrode connecting the demultiplexer and the second data line.

The display device may further include: a first fan-out line connecting the first connection electrode and the demultiplexer; and a second fan-out line connecting the demultiplexer and the second connection electrode. The first fan-out line may extend across the pad portion, the contact portion, and the display area, and the second fan-out line may extend across the display area and the contact portion.

The second fan-out line may include a (2-1) fan-out line connecting the demultiplexer and the (2-1) connection electrode, and a (2-2) fan-out line connecting the demultiplexer and the (2-2) connection electrode.

The at least one data line may extend in a first direction, and the first circuit portion may include a plurality of demultiplexers arranged in a second direction crossing the first direction.

Same demux select signal lines may be connected to the plurality of demultiplexers.

The at least one data line may extend in a first direction and include a plurality of data lines arranged along a second direction crossing the first direction, the first circuit portion may include a plurality of demultiplexers including a first demultiplexer and a second demultiplexer, and the first demultiplexer and the second demultiplexer may be connected to different data lines of the at least one data line.

The first demultiplexer and the second demultiplexer may be connected to different demux select signal lines.

The details of one or more exemplary embodiments of the present disclosure are set forth in the accompanying drawings and the description below.

According to an exemplary embodiment of the present disclosure, embedded circuits, for example, demultiplexing driving circuits are disposed in a display area to reduce a dead space of the display device that may be otherwise occupied by the embedded circuits.

However, features of the present disclosure are not restricted to the ones set forth herein. The above and other features of the present disclosure will become more apparent to one of ordinary skill in the art to which the present disclosure pertains by referencing the detailed description of the present disclosure given below.

BRIEF DESCRIPTION OF THE DRAWINGS

The aspects and features of the present disclosure will become more apparent by describing in detail exemplary embodiments thereof with reference to the attached drawings, in which.

DETAILED DESCRIPTION OF THE EMBODIMENTS

Figure 1:
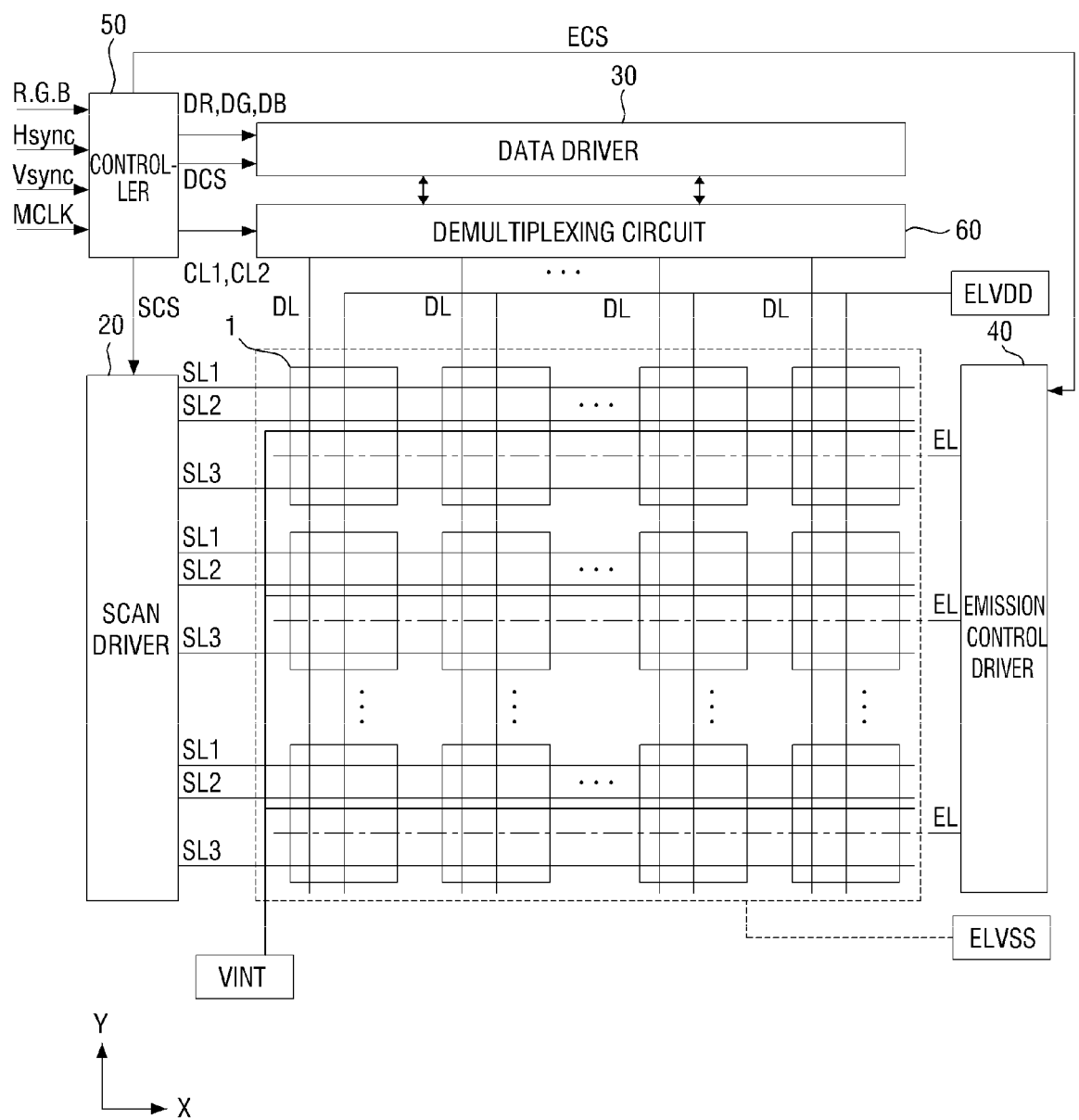
FIG. 1 is a block diagram schematically showing a display device according to an exemplary embodiment of the present disclosure.

Descriptions of exemplary embodiments of the present disclosure disclosed herein are only for illustrative purposes. The present disclosure may be embodied in many different forms without departing from the spirit and significant characteristics of the present disclosure. Therefore, the embodiments of the present disclosure should not be construed as limiting the present disclosure.

It will be understood that when an element is referred to as being related to another element such as being "coupled" or "connected" to another element, it can be directly coupled or connected to the other element, or one or more intervening elements may be present therebetween. In contrast, it should be understood that when an element is referred to as being related to another element such as being "directly coupled" or "directly connected" to another element, there may be no intervening elements present. Other expressions that explain the relationship between elements, such as "between," "directly between," "adjacent to," or "directly adjacent to," should be construed in the similar manner.

Throughout the specification, the same reference numerals will refer to the same or like elements and/or parts.

It will be understood that, although the terms "first," "second," "third" etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings herein.

The terminology used herein is for the purpose of describing particular embodiments and is not intended to be limiting. As used herein, "a," "an," "the," and "at least one" do not denote a limitation of quantity, and are intended to include both the singular and plural unless the context clearly indicates otherwise. For example, "an element" has the same meaning as "at least one element" unless the context clearly indicates otherwise. The phrase "at least one" is not to be construed as limiting "a" or "an." "Or" may mean "and/or." As used herein, the term "and/or" includes any and all combinations of one or more of the associated listed items. It will be further understood that the terms "comprises" and/or "comprising," or "includes" and/or "including" used herein, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the figures. It will be understood that relative terms are intended to encompass different orientations of a device including the element in addition to the orientation depicted in the figures. For example, if the device in one of the figures is turned over, elements described as being on a "lower" side of other elements would then be oriented to be on an "upper" side of the other elements. The exemplary term "lower" can, therefore, encompass both an orientation of "lower" and "upper" depending on the particular orientation of the figure. Similarly, if the device in one of the figures is turned over, elements described as "below" or "beneath" other elements would then be oriented to be "above" the other elements. The exemplary terms "below" or "beneath" can, therefore, encompass both an orientation of "above" and "below" depending on the particular orientation of the figure.

"About" or "approximately" used herein is inclusive of the stated value and means within an acceptable range of deviation for the stated value as determined by one of ordinary skill in the art, considering the measurement in question and an error associated with measurement of the particular quantity (i.e., the limitations of the measurement system). For example, "about" can mean within one or more standard deviations, or within ±30%, 20%, 10%, or 5% of the stated value.

Unless otherwise defined, terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments may be described herein with reference to cross sectional illustrations that are schematic illustrations of idealized embodiments. As such, variations from the shapes of the illustrations as a result of, for example, manufacturing techniques and/or tolerances, are to be expected. Thus, embodiments described herein should not be construed as limited to the particular shapes of regions as illustrated in the figures but are to include deviations in shapes that may cause by or result from manufacturing. For example, a region illustrated or described as flat may, typically, have rough and/or non-planar features. Moreover, sharp angles that are illustrated may be rounded. Thus, the regions illustrated in the figures are schematic in nature, and their shapes are not intended to illustrate the precise shape of a region and are not intended to limit the scope of the present disclosure.

Hereinafter, embodiments of the present disclosure will be described with reference to the attached drawings.

FIG. 1 is a block diagram schematically showing a display device according to an exemplary embodiment of the present disclosure.

A display device 10 may be applied to various portable electronic devices such as a mobile phone, a smart phone, a tablet personal computer (PC), a smart watch, a watch phone, a mobile communications terminal, an electronic notebook, an electronic book, a portable multimedia player (PMP), a navigation device, and a ultra mobile PC (UMPC), as well as a variety of products such as a television, a notebook, a monitor, a billboard, and the Internet of Things (IoT) devices.

The display device 10 can display images. Examples of the display device 10 include an organic light-emitting display (OLED) device, a liquid-crystal display (LCD) device, a plasma display (PDP) device, a field emission display (FED) device, an electrophoretic display (EPD) device, etc. Although the display device 10 is described as an organic light-emitting display device (OLED) in the following description, it should be noted that the present disclosure is not limited thereto.

Referring to FIG. 1, the display device 10 includes a plurality of pixels 1, a scan driver 20, a data driver 30, an emission control driver 40, a controller 50, and a demultiplexing circuit 60. In addition, the display device 10 may further include a plurality of scan lines SL1, SL2, and SL3, a plurality of data lines DL, and a plurality of emission control lines EL. In addition, the display device 10 may further include an initialization voltage supply line for supplying an initialization voltage VINT to each of the pixels 1, and a first supply voltage line for supplying a first supply voltage ELVDD to each of the pixels 1.

In the following description, an embedded circuit may refer to at least one of the scan driver 20, the emission control driver 40, and the demultiplexing circuit 60.

The plurality of scan lines SL1, SL2, and SL3 may include a first scan line SL1, a second scan line SL2, and a third scan line SL3. A first scan signal may be provided to the first scan line SL1, a second scan signal may be provided to the second scan line SL2, and a third scan signal may be provided to the third scan line SL3.

In some exemplary embodiments, the first scan line SL1, the second scan line SL2, and the third scan line SL3 may extend in a first direction X. The first scan line SL1, the second scan line SL2, and the third scan line SL3 may be arranged in this order in a second direction Y crossing the first direction X. The first scan line SL1, the second scan line SL2, and the third scan line SL3 may form a group, and a plurality of such groups may be arranged along the second direction Y.

Data signals may be provided to the data lines DL. In some exemplary embodiments, the data lines DL may extend in the second direction Y, and may be arranged along the first direction X.

Emission control signals may be provided to the emission control lines EL. In some exemplary embodiments, the emission control lines EL may extend in the first direction X, and may be arranged along the second direction Y.

Each of the pixels 1 may be connected to a group of the first scan line SL1, the second scan line SL2, the third scan line SL3, one of the data lines DL, and one of the emission control lines EL. In some exemplary embodiments, the pixels 1 may be arranged in, but not limited to, a matrix. The pixels 1 may be arranged in a PenTile structure or a variety of other ways.

As will be described later, each of the pixels 1 may include an organic light-emitting diode OLED (see FIG. 3) or a light-emitting element, and at least one transistor electrically connected to the organic light-emitting diode OLED. For example, the pixel may include a plurality of transistors T1 to T7 (see FIG. 3). The organic light-emitting diode OLED may include an anode electrode ANO (see FIG. 7), a cathode electrode CAT (see FIG. 7) facing the anode electrode ANO, and an organic layer OL (see FIG. 7) disposed between the anode electrode ANO and the cathode electrode CAT. In some exemplary embodiments, each of the pixels 1 may further include, but not limited to, a storage capacitor Cst (see in FIG. 3).

The initialization voltage supply line may provide the initialization voltage VINT to each of the pixels 1. In some exemplary embodiments, a plurality of initialization voltage supply lines may extend in the first direction X and be arranged along the second direction Y. The initialization voltage supply lines may be electrically connected to the pixels 1 to supply the initialization voltage VINT to the pixels 1.

The first supply voltage supply line for supplying the first supply voltage ELVDD to each of the pixels 1 may extend in the second direction Y, and a plurality of first supply voltage supply lines may be arranged along the first direction X. The first supply voltage supply lines may be electrically connected to the pixels 1 to provide first supply voltages ELVDD to the pixels 1.

A second supply voltage supply electrode may be electrically connected to the above-described cathode electrode CAT (see FIG. 7) to supply a second supply voltage ELVSS to the cathode electrode CAT.

The scan driver 20 may generate three scan signals and transmit them to each of pixels 1 through, for example, the plurality of scan lines SL1, SL2, and SL3. Specifically, the scan driver 20 provides the first scan signal to the first scan line SL1, the second scan signal to the second scan line SL2, and the third scan signal to the third scan line SL3.

The data driver 30 outputs data signals. The data signals output from the data driver 30 are transmitted to the demultiplexing circuit 60.

The demultiplexing circuit 60 may be electrically connected to the data lines DL. The demultiplexing circuit 60 may generate data signals of the data lines DL from the data signals provided by the data driver 30, and may provide them to the data lines DL.

Figure 2:
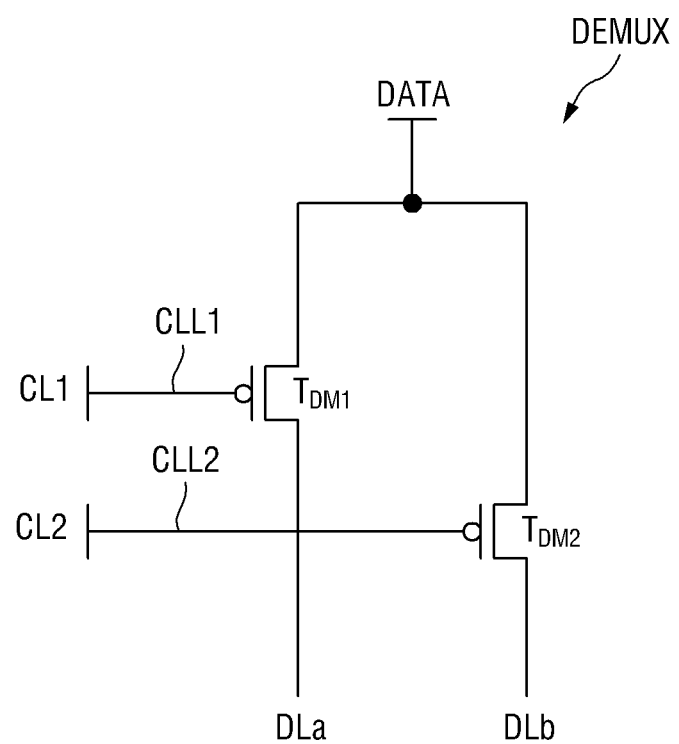
FIG. 2 is a circuit diagram of a demultiplexer included in a demultiplexer circuit of a display device according to the exemplary embodiment of the present disclosure.

The demultiplexing circuit 60 may include a plurality of demultiplexers DEMUX (see FIG. 2). Each of the demultiplexers DEMUX may provide the received data signal to two or more data lines DL. For example, when two data lines DL are connected to one demultiplexer DEMUX, the data signal provided from the data driver 30 may be transferred to the demultiplexer DEMUX, and the demultiplexer DEMUX that receives the data signal DATA may divide the data signal DATA by timeslots and transmit divided data signals to the two data lines DL, respectively. In the example shown in FIG. 1, the data driver 30 is electrically connected to the demultiplexing circuit 60, and the demultiplexing circuit 60 is electrically connected to the data lines DL.

The data lines DL may include a first data line DLa and a second data line DLb, each of which receives a data signal divided by using the time-division multiplexing. For example, the first data line DLa may refer to a data line DL that receives a divided data signal earlier, and the second data line DLb may refer to a data line DL that receives a divided data signal later. In another example, the second data line DLb may receive a divided data signal earlier, and the first data line DLa may receive a divided data signal later.

It is noted that the first data line DLa and the second data line DLb are designated for distinguishing between the data lines depending on the order that they receive the divided data signals, and not necessarily for describing a sequential or chronological order.

Figure 7:
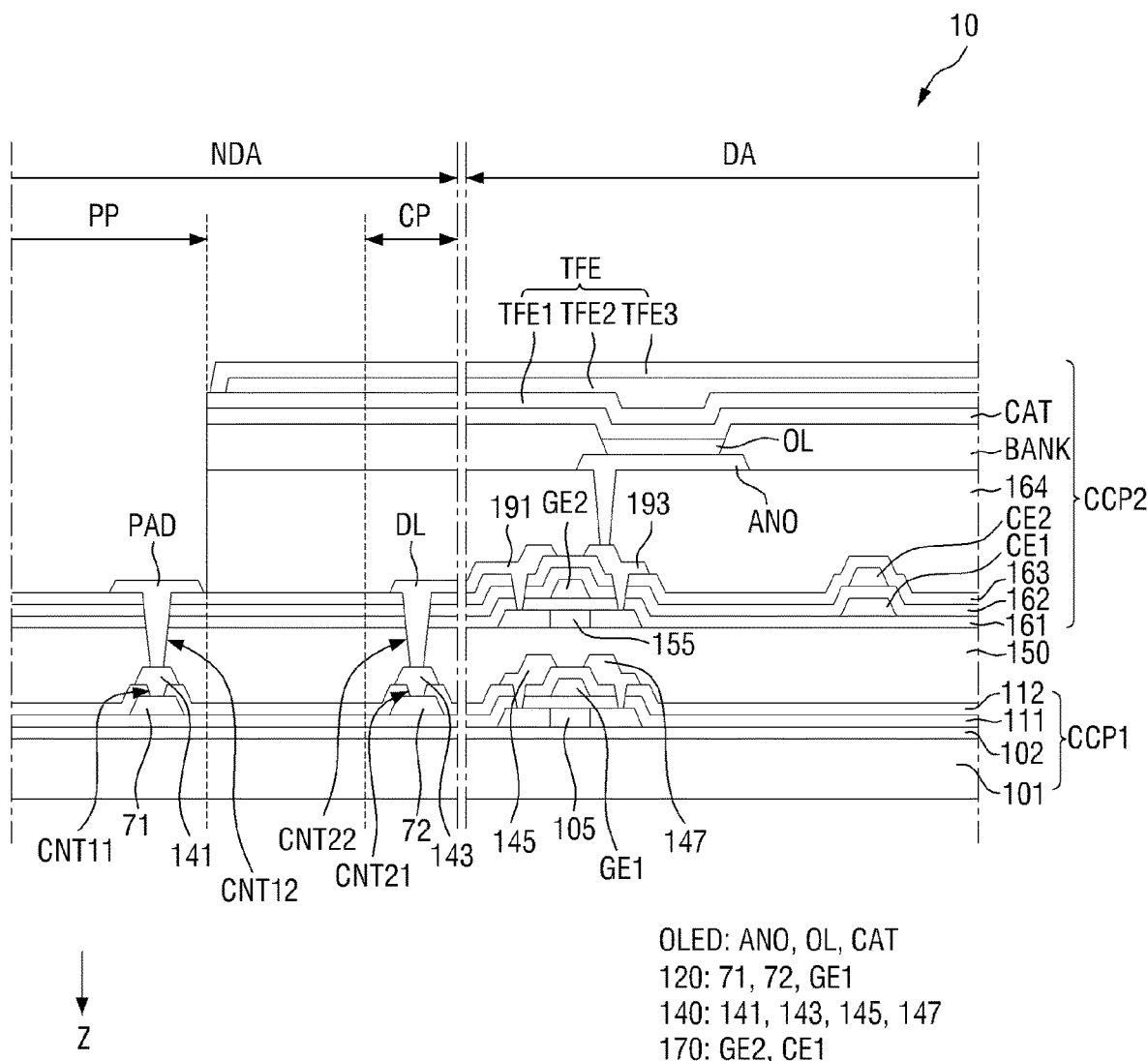
FIG. 7 is a cross-sectional view of a display device according to an exemplary embodiment of the present disclosure.

In some exemplary embodiments, the data driver 30 and the demultiplexing circuit 60 may be electrically connected to each other through a pad PAD, a first connection electrode (e.g., a first connection electrode 141 shown in FIG. 7), and a first fan-out line (e.g., a first fan-out line 71 shown in FIG. 7). The demultiplexing circuit 60 may be electrically connected to the data lines DL via a second fan-out line (e.g., a second fan-out line 72 shown in FIG. 7) and a second connection electrode (e.g., a second connection electrode 143 shown in FIG. 7).

The demultiplexer DEMUX will be described in detail with reference to FIG. 2.

FIG. 2 is a circuit diagram of a demultiplexer included in a demultiplexer circuit of a display device according to the exemplary embodiment of the present disclosure. In the example shown in FIG. 2, two data lines including the first data line DLa and the second data line DLb are connected to the demultiplexer.

Referring to FIG. 2, the demultiplexer DEMUX includes a first demux transistor $T_{DM1}$ and a second demux transistor $T_{DM2}$. In the examples of FIG. 2, both the first demux transistor $T_{DM1}$ and the second demux transistor $T_{DM2}$ are shown to be P-type metal-oxide-semiconductor (PMOS) transistors, but the present disclosure is not limited thereto. Each of the first demux transistor $T_{DM1}$ and the second demux transistor $T_{DM2}$ includes a first electrode, a second electrode, and a gate electrode.

A data signal DATA output from the data driver 30 of FIG. 1 is provided to the first electrode of the first demux transistor $T_{DM1}$. The second electrode of the first demux transistor $T_{DM1}$ may be electrically connected to the first data line DLa. A first demux select signal CL1 may be provided to the gate electrode of the first demux transistor $T_{DM1}$ through a first demux select signal line CLL1. When the first demux select signal CL1 having a low level is applied to the gate electrode of the first demux transistor $T_{DM1}$, the first demux transistor $T_{DM1}$ is turned on so that the data signal DATA may be output to the first data line DLa.

The data signal DATA output from the data driver 30 of FIG. 1 is also provided to the first electrode of the second demux transistor $T_{DM2}$. The second electrode of the second demux transistor $T_{DM2}$ may be electrically connected to the second data line DLb that is not connected to the first demux transistor $T_{DM1}$. A second demux select signal CL2 may be provided to the gate electrode of the second demux transistor $T_{DM2}$ through a second demux select signal line CLL2. When the second demux select signal CL2 having a low level is applied to the gate electrode of the second demux transistor $T_{DM2}$, the second demux transistor $T_{DM2}$ is turned on so that the data signal DATA may be output to the second data line DLb.

As the first demux transistor $T_{DM1}$ or the second demux transistor $T_{DM2}$ is turned on in response to the first demux select signal CL1 or the second demux select signal CL2 described above, the data signal DATA may be selectively applied to the two data lines DLa and DLb. In some exemplary embodiments, when the first demux select signal CL1 and the second demux select signal CL2 have different timings, the data signal DATA can be transmitted in a time-division multiplexing scheme.

According to the above-exemplary embodiments, the demultiplexer DEMUX provides the data signal DATA received from the data driver 30 to the two data lines DLa and DLb. It is, however, to be understood that the data signal DATA may be provided to three or more data lines without deviating from the scope of the present disclosure. When one demultiplexer DEMUX provides the data signal DATA to three or more data lines, the demultiplexer DEMUX may include three or more demux transistors corresponding to the number of data lines.

Referring back to FIG. 1, the emission control driver 40 generates and transmits an emission control signal to each of the pixels 1 through a plurality of emission control lines EL. The emission control signal controls the emission timing of the pixels 1. In some exemplary embodiments, the emission control driver 40 may be integrally formed with the scan driver 20, and the integrally formed driver can generate the emission control signal as well as the scan signal. The emission control driver 40 may be omitted depending on the internal structure of the pixels 1.

The controller 50 converts a plurality of image signals R, G, and B received from an external device into a plurality of image data signals DR, DG, and DB, and transmits them to the data driver 30. In addition, the controller 50 receives a vertical synchronization signal $V_{sync}$, a horizontal synchronization signal $H_{sync}$, and a clock signal MCLK and generates various control signals for controlling the driving of the scan driver 20, the data driver 30, and the emission control driver 40, and transmits the control signals to them. For example, the controller 50 generates a scan driving control signal SCS for controlling the scan driver 20, a data driving control signal DCS for controlling the data driver 30, and an emission driving control signal ECS for controlling the emission control driver 40 and transmits those control signals to them, respectively. In addition, the controller 50 generates and transmits the demux selection signals CL1 and CL2 that control the operation of the demultiplexer DEMUX to the demultiplexing circuit 60.

Figure 3:
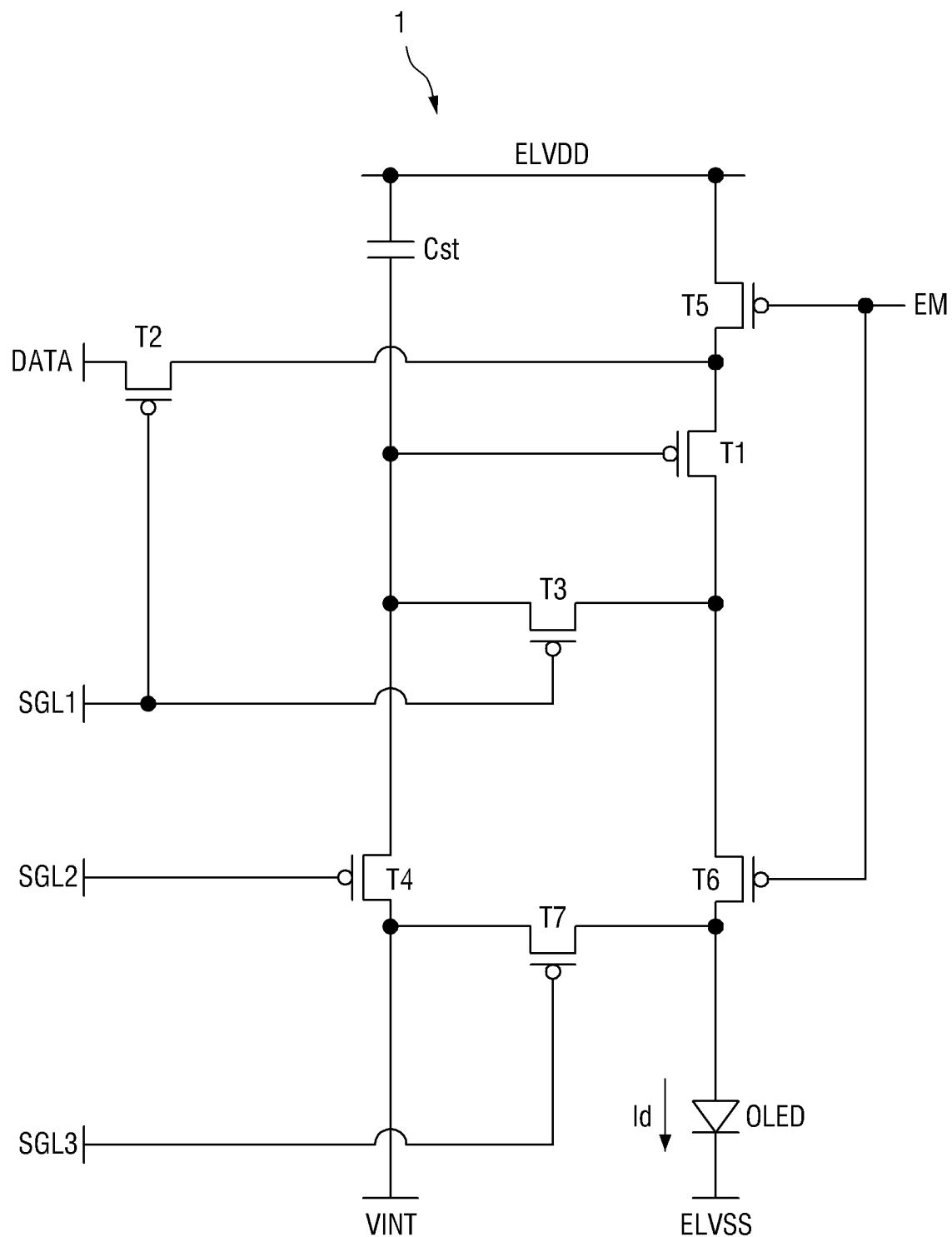
FIG. 3 is an equivalent circuit diagram of a pixel of a display device according to an exemplary embodiment of the present disclosure.

FIG. 3 is an equivalent circuit diagram of a pixel of a display device according to an exemplary embodiment of the present disclosure.

Referring to FIG. 3, the circuit of a pixel 1 of a display device may include an organic light-emitting diode OLED, a plurality of transistors T1 to T7, and a storage capacitor Cst. To the circuit of the pixel 1, a data signal DATA, a first scan signal SGL1, a second scan signal SGL2, a third scan signal SGL3, an emission control signal EM, a first supply voltage ELVDD, a second supply voltage ELVSS, and an initialization voltage VINT are applied.

The storage capacitor Cst may include a first electrode and a second electrode.

Each of the transistors T1 to T7 includes a gate electrode, a first electrode, and a second electrode. One of the first electrode and the second electrode of each of the transistors T1 to T7 corresponds to a source electrode and the other corresponds to a drain electrode.

Each of the transistors T1 to T7 may be a thin-film transistor. Each of the transistors T1 to T7 may be either a PMOS transistor or an N-type metal-oxide-semiconductor (NMOS) transistor. Although all the transistors T1 to T7 of the pixel are shows to be PMOS transistors in the example of FIG. 3, the present disclosure is not limited thereto. For example, all the transistors T1 to T7 may be NMOS transistors. Alternatively, some of the transistors T1 to T7 may be PMOS transistors, and others may be NMOS transistors.

The gate electrode of the first transistor T1 is connected to the first electrode of the storage capacitor Cst. The first electrode of the first transistor T1 is connected to the first supply voltage terminal via the fifth transistor T5. The second electrode of the first transistor T1 is connected to the anode electrode ANO of the organic light-emitting diode OLED via the sixth transistor T6. The first transistor T1 receives the data signal DATA according to the switching operation of the second transistor T2 and provides the driving current Id to the organic light-emitting diode OLED.

The gate electrode of the second transistor T2 is connected to a terminal from which the first scan signal SGL1 is provided. The first electrode of the second transistor T2 is connected to a terminal from which the data signal DATA is provided. The second electrode of the second transistor T2 is connected to the first electrode of the first transistor T1 and a terminal from which the first supply voltage ELVDD is applied through the fifth transistor T5. The second transistor T2 is turned on in response to the first scan signal SGL1 and provides the data signal DATA to the first electrode of the first transistor T1.

The gate electrode of the third transistor T3 is connected to a terminal from which the first scan signal SGL1 is provided. The first electrode of the third transistor T3 is connected to the second electrode of the first transistor T1 and the anode electrode ANO of the organic light-emitting diode OLED via the sixth transistor T6. The second electrode of the third transistor T3 is connected to the first electrode of the storage capacitor Cst, the first electrode of the fourth transistor T4 and the gate electrode of the first transistor T1. When the third transistor T3 is turned on in response to the first scan signal SGL1, the gate electrode of the first transistor is connected with the second electrode of the first transistor T1 such that the first transistor T1 is diode-connected. The threshold voltage of the first transistor T1 may cause a voltage difference between the first electrode and the gate electrode of the first transistor T1. Deviations in the threshold voltage of the first transistor T1 can be compensated by supplying the data signal DATA that compensates for the threshold voltage to the gate electrode of the first transistor T1.

The gate electrode of the fourth transistor T4 is connected to a terminal from which the second scan signal SGL2 is provided. The second electrode of the fourth transistor T4 is connected to a terminal from which the initialization voltage VINT is provided. The first electrode of the fourth transistor T4 is connected to the first electrode of the storage capacitor Cst, the second electrode of the third transistor T3, and the gate electrode of the first transistor T1. The fourth transistor T4 is turned on in response to the second scan signal SGL2 and provides the initialization voltage VINT to the gate electrode of the first transistor T1 to initialize the voltage at the gate electrode of the first transistor T1.

The gate electrode of the fifth transistor T5 is connected to a terminal from which the emission control signal EM is provided. The first electrode of the fifth transistor T5 is connected to the terminal from which the first supply voltage ELVDD is provided. The second electrode of the fifth transistor T5 is connected to the first electrode of the first transistor T1 and the second electrode of the second transistor T2.

The gate electrode of the sixth transistor T6 is connected to the terminal from which the emission control signal EM is provided. The first electrode of the sixth transistor T6 is connected to the second electrode of the first transistor T1 and the first electrode of the third transistor T3. The second electrode of the sixth transistor T6 is connected to the anode electrode ANO of the organic light-emitting diode OLED.

The fifth transistor T5 and the sixth transistor T6 are simultaneously turned on in response to the emission control signal EM so that the driving current Id flows through the organic light-emitting diode OLED.

The gate electrode of the seventh transistor T7 is connected to a third scan signal terminal from which the third scan signal SGL3 is provided. The first electrode of the seventh transistor T7 is connected to the anode electrode ANO of the organic light-emitting diode OLED. The second electrode of the seventh transistor T7 is connected to the terminal from which the initialization voltage VINT is provided. The seventh transistor T7 is turned on according to the third scan signal SGL3 and initializes the anode electrode ANO of the organic light-emitting diode OLED.

The second electrode of the storage capacitor Cst is connected to the first supply voltage terminal. The first electrode of the storage capacitor Cst is connected to the gate electrode of the first transistor T1, the second electrode of the third transistor T3, and the first electrode of the fourth transistor T4. The cathode electrode CAT of the organic light-emitting diode OLED is connected to the terminal from which the second voltage ELVSS is provided. The organic light-emitting diode OLED emits light to display an image corresponding to the driving current Id.

Hereinafter, the structure of the above-described display device 10 will be described in more detail.

Figure 4:
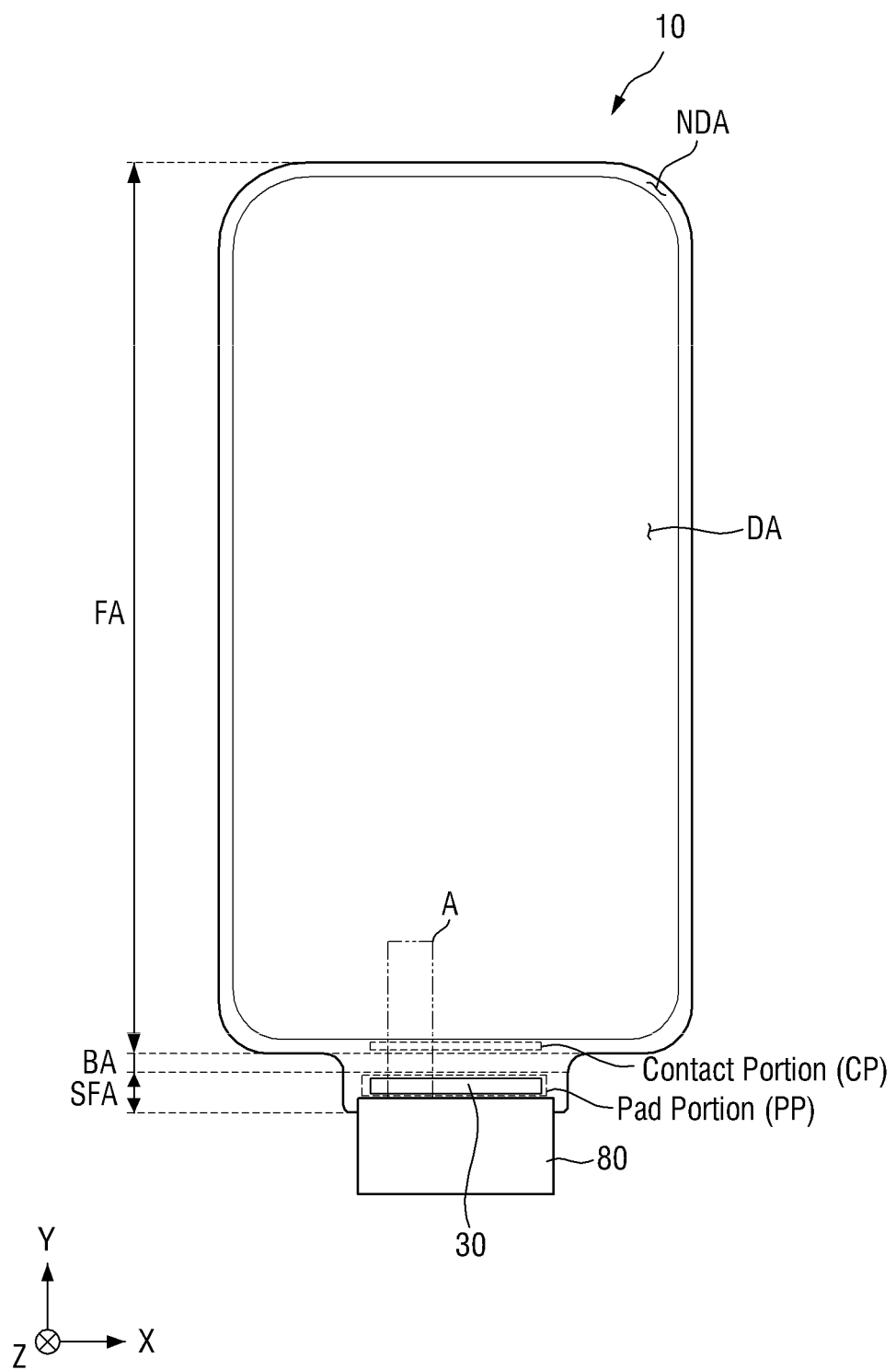
FIG. 4 is a plan view showing a layout of a display device according to an exemplary embodiment of the present disclosure.
Figure 5:
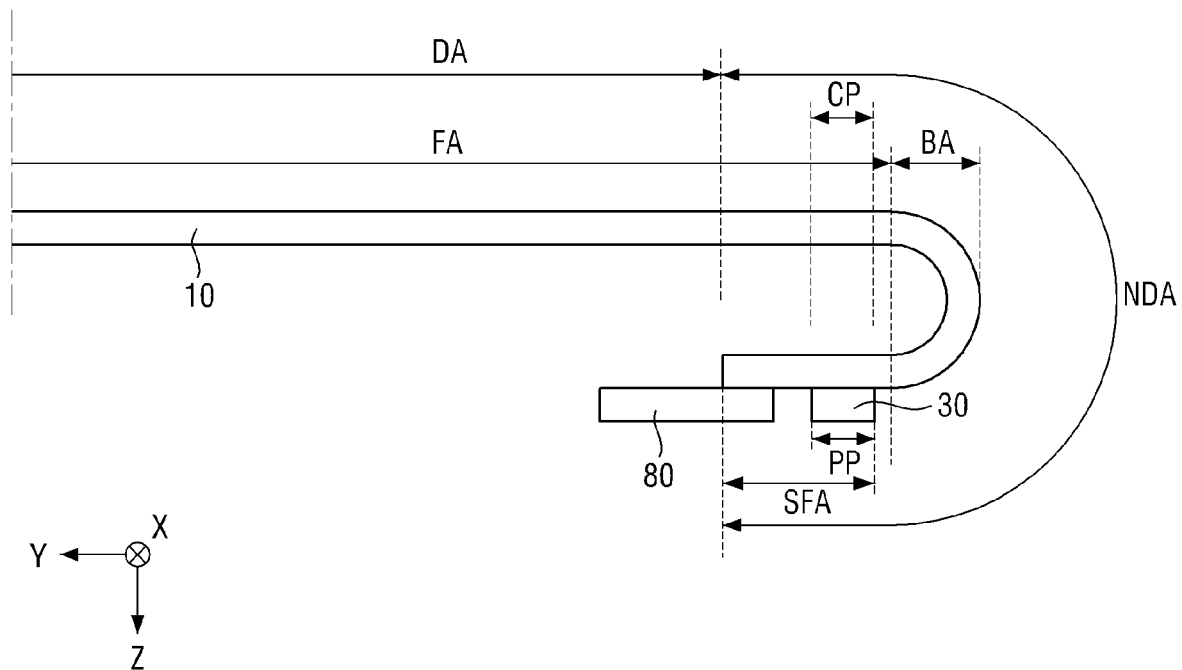
FIG. 5 is a cross-sectional view of a display device according to an exemplary embodiment of the present disclosure.
Figure 6:
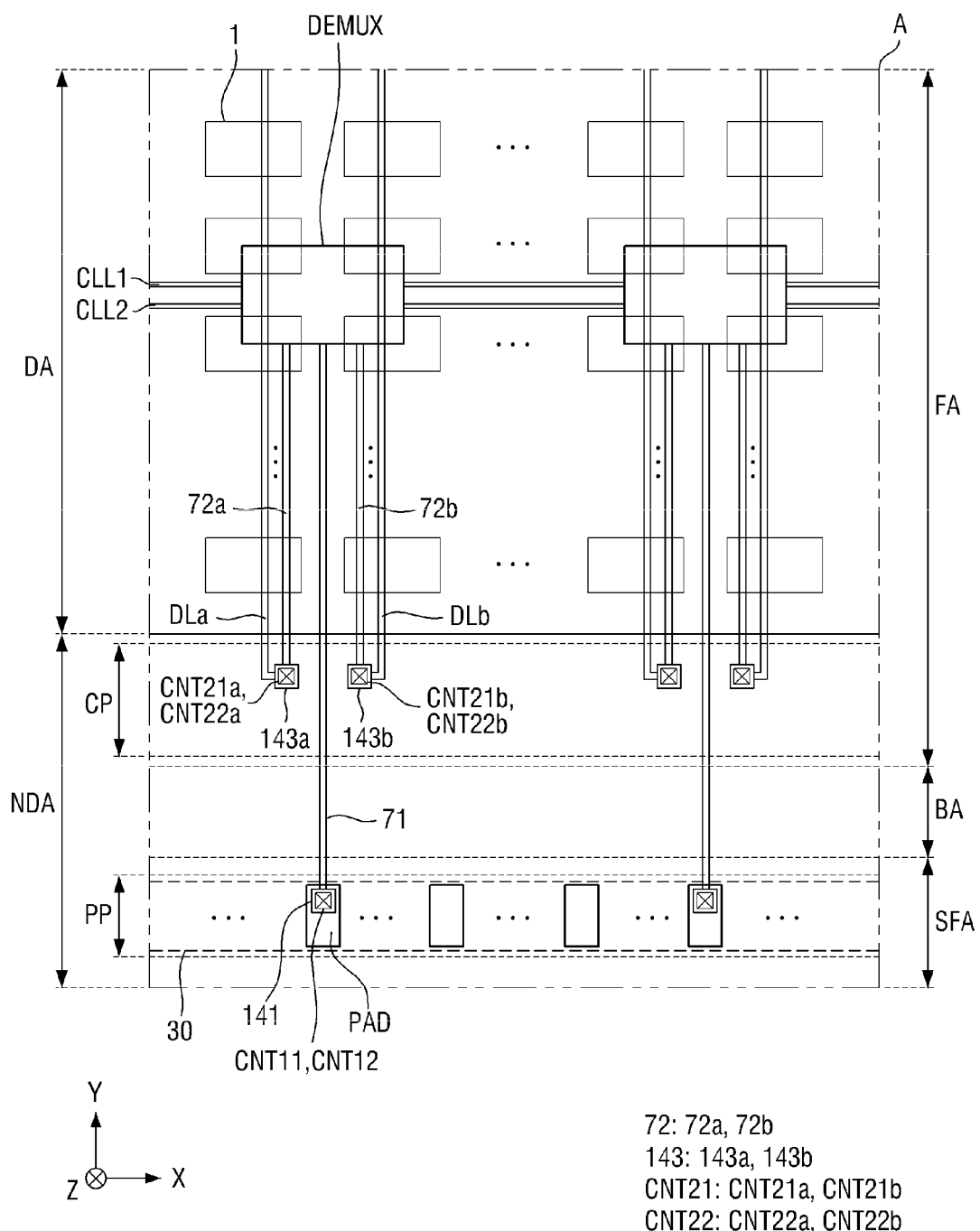
FIG. 6 is an enlarged view of area A shown in FIG. 4.

FIG. 4 is a plan view showing a layout of a display device according to an exemplary embodiment of the present disclosure. FIG. 5 is a cross-sectional view of a display device according to an exemplary embodiment of the present disclosure. FIG. 6 is an enlarged view of area A shown in FIG. 4. FIG. 7 is a cross-sectional view of a display device according to an exemplary embodiment of the present disclosure.

The display device 10 may include a flexible substrate including a flexible polymer material such as polyimide. Accordingly, the display device 10 may be curved, bent, folded, or rolled.

The display device 10 may include a display area DA where images are displayed, and a non-display area NDA where no image is displayed. The display device 10 may include the display area DA and the non-display area NDA when viewed from the top in a plan view as illustrated in FIG. 4. The non-display area NDA may surround the display area DA.

The display area DA may include a plurality of pixels 1. Each of the pixels 1 may include an emissive layer and a circuit layer for controlling the amount of light emitted from the emissive layer. The circuit layer may include lines, electrodes, and at least one transistor. The emissive layer may include an organic light-emitting material. The emissive layer may be sealed by an encapsulation layer. The configuration of each of the pixels 1 will be described in detail later.

The display device 10 may include a flat area FA and a bending area BA connected to the lower side of the flat area FA in the second direction Y when viewed from the top. The display device 10 may further include a subsidiary flat area SFA connected to the lower side of the bending area BA in the second direction Y and bent in a thickness direction Z (or a third direction) of the display device 10 to overlap the flat area FA in the thickness direction Z.

The flat area FA may include the display area DA. The non-display area NDA may be positioned at the peripheral area of the display area DA.

The flat area FA may have a shape similar to the appearance of the display device 10 when viewed from the top. The flat area FA may correspond to a flat region on a plane. It is, however, to be understood that the present disclosure is not limited thereto. At least one of the edges (or sides) of the flat area FA, for example, an edge (or side) that is connected to the bending area BA, may be bent to form a curved surface. Referring to FIG. 5, the edge that is connected to the bending area BA may be bent at a right angle.

When at least one of the edges (or sides) of the flat area FA is curved or bent, the display area DA may also be disposed on the curved or bent edge. It is, however, to be understood that the present disclosure is not limited thereto. The non-display area NDA that does not a display image may be disposed on the curved or bent edge, or the display area DA and the non-display area NDA may be disposed together on the curved or bent edge.

The non-display area NDA of the flat area FA may extend from the outer border of the display area DA to the edge of the display panel 10.

The bending area BA may be connected to one shorter side of the flat area FA. The width of the bending area BA in the first direction X may be narrower than the width of shorter side of the flat area FA. The portion where the flat area FA meets the bending area BA may be cut in an L-shape to reduce a bezel width.

In the bending area BA, the display device 10 may be bent with a curvature toward the opposite side of the display surface. As the display device 10 is bent in the bending area BA, the surface of the display device 10 may be reversed. Specifically, the surface of the display device 10 facing upward may be bent such that it faces outward at the bending area BA and then faces downward.

The subsidiary flat area SFA may extend from the bending area BA. The subsidiary flat area SFA may extend in a direction parallel to the flat area FA after the display device 10 has been bent. The subsidiary flat area SFA may overlap the flat area FA in the thickness direction Z of the display device 10. The subsidiary flat area SFA may overlap the non-display area NDA at the edge of the flat area FA. The width of the subsidiary flat area SFA may be, but is not limited to being, equal to the width of the bending area BA.

As will be described below, the display device 10 may include a first circuit portion (e.g., a first circuit portion CCP1 shown in FIG. 7), a second circuit portion (e.g., a second circuit portion CCP2 shown in FIG. 7) disposed on the first circuit portion, and an interlayer dielectric layer (e.g., an interlayer dielectric layer 150 shown in FIG. 7) disposed between the first circuit portion and the second circuit portion. The first circuit portion, the second circuit portion, and the interlayer dielectric layer may be disposed to encompass both the display area DA and the non-display area NDA.

In the display area DA, the pixel of the second circuit portion and an embedded circuit of the first circuit portion are disposed. In the non-display area NDA, a pad portion PP and a contact portion CP located between the pad portion PP and the display area DA may be disposed. The embedded circuit of the first circuit portion may correspond to the demultiplexing circuit 60 described above with reference to FIG. 1. The display area DA, the pad portion PP, and the contact portion CP will be described in more detail later.

As the embedded circuit is disposed in the display area DA, the non-display area NDA of the display device 10 can be reduced. Accordingly, the space where circuits or the like are disposed, for example, a dead space can be reduced.

The pad portion PP may be disposed on the subsidiary flat area SFA of the display device 10. A plurality of pads PAD may be disposed in the pad portion PP. An external device may be mounted (or attached) on the pad portion PP. An example of the external device may be the data driver 30 described above. The pad portion PP may be disposed in the non-display area NDA.

Either one data driver 30 or a number of data drivers may be mounted in the subsidiary flat area SFA. For example, as shown in FIG. 4, the data driver 30 may be disposed in the subsidiary flat area SFA of the display device 10, and a driving substrate 80 may be attached to an end of the subsidiary flat area SFA. In this instance, the pad portion PP may include both a first pad portion connected to the data driver 30 and a second pad portion connected to the driving substrate 80.

The data driver 30 may be attached to the display device 10 by an anisotropic conductive film or by ultrasonic bonding.

The data driver 30 may include an integrated circuit for driving the display device 10. In an exemplary embodiment, the integrated circuit may be, but is not limited to, a data driving integrated circuit that generates and provides the data signal DATA. The data driver 30 is connected to the pad PAD disposed in the pad portion PP of the display device 10 to provide the data signal DATA to the pad PAD.

The contact portion CP may be disposed in the non-display area NDA of the flat area FA.

In some exemplary embodiments, the contact portion CP may be located in the bending area BA.

Hereinafter, the display area DA, the pad portion PP, and the contact portion CP will be described in more detail with reference to FIGS. 6 and 7.

Referring to FIGS. 6 and 7, the display device 10 may include the plurality of demultiplexers DEMUX, the plurality of pixels 1, the plurality of pads PAD disposed in the pad portion PP, the first fan-out line 71, the second fan-out line 72, the first connection electrode 141, the second connection electrode 143 and the data lines DL. The plurality of demultiplexers DEMUX may be arranged in the first direction X. The first demux select signal line CLL1 that provides the first demux select signal CL1, and the second demux select signal line CLL2 that provides the second demux select signal CL2 may pass through the demultiplexers DEMUX, which have been described above with reference to FIGS. 1 and 2.

The first demux select signal line CLL1 and the second demux select signal line CLL2 may extend in the first direction X.

Although the first demux select signal line CLL1 is shown in FIG. 6 to be located above the second demux select signal line CLL2 in the second direction Y, the present disclosure is not limited thereto.

The demultiplexer DEMUX may overlap some adjacent pixels 1, and may not overlap other pixels 1 when viewed from the top.

The second fan-out line 72 may include a (2-1) fan-out line 72a and a (2-2) fan-out line 72b. Like the first data line DLa and the second data line DLb, it is noted that the (2-1) fan-out line 72a and the (2-2) fan-out line 72b are also designated for distinguishing between the two fan-out lines of the second fan-out line 72 depending on the order that they receive the divided data signals from the demultiplexer DEMUX, and not necessarily for describing a sequential or chronological order.

The second connection electrode 143 may include a (2-1) connection electrode 143a and a (2-2) connection electrode 143b. Like the first data line DLa and the second data line DLb, it is noted that the (2-1) connection electrode 143a and the (2-2) connection electrode 143b are also designated for distinguishing between the two connection electrodes of the second connection electrode 143 depending on the order that they receive the divided data signals from the demultiplexer DEMUX, and not necessarily for describing a sequential or chronological order.

The demultiplexer DEMUX of the demultiplexing circuit 60 and the pixels 1 may be disposed in the display area DA of the display device 10, the second connection electrodes 143 including the (2-1) connection electrode 143a and the (2-2) connection electrode 143b may be disposed in the contact portion CP of the display device 10, and the plurality of pads PAD and the first connection electrode 141 may be disposed in the pad portion PP of the display device 10. The first fan-out line 71 may be disposed across the display area DA and the pad portion PP of the display device 10, and the second fan-out lines 72 including the (2-1) fan-out line 72a and the (2-2) fan-out line 72b and the data line DL including the first data line DLa and the second data line DLb may be disposed across the display area DA and the contact portion CP of the display device 10.

The first fan-out line 71 and the second fan-out lines 72 including the (2-1) fan-out line 72a and the (2-2) fan-out line 72b may be electrically connected to embedded circuit transistors included in the embedded circuit. In some exemplary embodiments, the embedded circuit transistors may correspond to the demux transistors included in the demultiplexer DEMUX. The first fan-out line 71 and the second fan-out lines 72: the (2-1) fan-out line 72a and the (2-2) fan-out line 72b may be electrically connected to the demux transistors included in the demultiplexer DEMUX. Referring to FIG. 7, each of the demux transistors of the demultiplexing circuit 60 may include a gate electrode GE1, a source electrode 145, and a drain electrode 147 disposed on an embedded circuit semiconductor layer 105.

As described above with reference to FIG. 2, the demux transistors may include the first demux transistor $T_{DM1}$ and the second demux transistor $T_{DM2}$. The first fan-out line 71 may be connected to each of the first demux transistor $T_{DM1}$ and the second demux transistor $T_{DM2}$. The (2-1) fan-out line 72a may be connected to the first demux transistor $T_{DM1}$, and the (2-2) fan-out line 72b may be connected to the second demux transistor $T_{DM2}$. It is, however, to be understood that the present disclosure is not limited thereto. The (2-1) fan-out line 72a may be connected to the second demux transistor $T_{DM2}$, and the (2-2) fan-out line 72b may be connected to the first demux transistor $T_{DM1}$.

The pads PAD may be spaced apart from each other in the first direction X that intersects the second direction Y from the pad portion PP to the contact portion CP. The data driver 30 may be attached to the pads PAD as described above.

The data driver 30 may provide the data signal DATA to the pads PAD. The data signal DATA provided to the pads PAD from the data driver 30 may be provided to the first fan-out line 71 via the first connection electrode 141. That is, the pads PAD may be electrically connected to the first fan-out line 71 through the first connection electrode 141. In some exemplary embodiments, the first fan-out line 71 may extend to the demultiplexer DEMUX and may be electrically connected to the demultiplexer DEMUX.

The second fan-out line 72 may electrically connect the demultiplexing circuit 60 with the data line DL. Specifically, the (2-1) fan-out line 72a may be electrically connected to the demultiplexer DEMUX and the first data line DLa, and the (2-2) fan-out line 72b may be electrically connected to the demultiplexer DEMUX and the second data line DLb.

In some exemplary embodiments, the second connection electrode 143 may be located closer to the display area DA than the first connection electrode 141.

The data lines DL may be electrically connected to the second connection electrodes 143 and the pixel 1. Specifically, the first data line DLa may be electrically connected to the (2-1) connection electrode 143a and the pixel 1, and the second data line DLb may be electrically connected to the (2-2) connection electrode 143b and the pixel 1.

The first data line DLa may be located on one side of the first fan-out line 71, and the second data line DLb may be located on the other side of the first fan-out line 71 in the first direction X when viewed from the top in the plan view. The (2-1) fan-out line 72a may be located on one side of the first fan-out line 71, and the (2-2) fan-out line 72b may be located on the other side of the first fan-out line 71, respectively closer than the first data line DLa and the second data line DLb in the first direction X. It is, however, to be understood that the arrangement of the first data line DLa, the second data line DLb, the (2-1) fan-out line 72a, and the (2-2) fan-out line 72b is not limited thereto but may be modified in a variety of ways.

In some exemplary embodiments, the demultiplexer DEMUX may be disposed in the display area DA. In some exemplary embodiments, the demultiplexer DEMUX may overlap at least some of the pixels 1. For example, the demux transistor included in the demultiplexer DEMUX may overlap at least one of the transistors (e.g., the transistors T1 to T7) included in the pixels 1. It is, however, to be understood that the present disclosure is not limited thereto. Both the demultiplexer DEMUX and the pixels 1 may be disposed in the display area DA such that they do not overlap each other when viewed from the top in the plan view.

The stack structure of the display device 10 will be described. Referring to FIG. 7, the display device 10 may include a first circuit portion CCP1, a second circuit portion CCP2, and an interlayer dielectric layer 150 disposed between the first circuit portion CCP1 and the second circuit portion CCP2. Although FIG. 7 illustratively shows only the second fan-out line 72, the data line DL, the second connection electrode 143, a (2-1) contact hole CNT21, and a (2-2) contact hole CNT22, in practice, it is to be understood that the stack structure may include the (2-1) fan-out line 72a, the first data line DLa, the (2-1) connection electrode 143a, a (2-1-1) contact hole CNT21a, and a (2-2-1) contact hole CNT22a, or the (2-2) fan-out line 72b, the second data line DLb, the (2-2) connection electrode 143b, a (2-1-2) contact hole CNT21b, and a (2-2-2) contact hole CNT22b.

The first circuit portion CCP1, the second circuit portion CCP2, and the interlayer insulating layer 150 may be disposed in the display area DA and the non-display area NDA. The first circuit portion CCP1, the second circuit portion CCP2, and the interlayer insulating layer 150 may be disposed to encompass the surface of the pad portion PP, the contact portion CP, and the display area DA.

Initially, the first circuit portion CCP1 will be described. The first circuit portion CCP1 may include at least one embedded circuit. The embedded circuit may include the demultiplexing circuit 60 as described above. Referring to FIG. 7, only one demux transistor included in the demultiplexing circuit 60 is shown as an example of the embedded circuit. However, it is noted that the present disclosure is not limited thereto. The first circuit portion CCP1 includes a base substrate 101, a plurality of conductive layers disposed on the base substrate 101, and a plurality of insulating layers disposed between the plurality of conductive layers. In addition, the first circuit portion CCP1 may include the base substrate 101 and a transistor of the at least one embedded circuit disposed on the base substrate 101.

The base substrate 101 encompasses the pad portion PP, the contact portion CP, and the display area DA. The base substrate 101 may support a variety of elements disposed thereon. In some exemplary embodiments, the base substrate 101 may be a flexible substrate including a flexible material such as polyimide (PI).

A buffer layer 102 may be disposed on the base substrate 101. The buffer layer 102 can be used to prevent moisture and oxygen from permeating from the outside through the base substrate 101. In some exemplary embodiments, the buffer layer 102 may include one of silicon nitride (SiNx), silicon oxide (SiO$_2$), and silicon oxynitride (SiOxNy).

The embedded circuit semiconductor layer 105 may be disposed on the buffer layer 102. The embedded circuit semiconductor layer 105 forms a channel of the demux transistor included in the demultiplexer DEMUX (see FIG. 2). The embedded circuit semiconductor layer 105 may be disposed in the display area DA. The embedded circuit semiconductor layer 105 may include a source region, a drain region, and an active region.

The embedded circuit semiconductor layer 105 may include polycrystalline silicon. The polycrystalline silicon may be formed by crystallizing amorphous silicon. Examples of the crystallizing techniques may include, but are not limited to, rapid thermal annealing (RTA), solid phase crystallization (SPC), excimer laser annealing (ELA), metal induced crystallization (MIC), metal induced lateral crystallization (MILC), sequential lateral solidification (SLS), etc. The portions of the embedded circuit semiconductor layer 105 that are connected to the source/drain electrodes of each of the transistors (i.e., source/drain regions) may be doped with impurity ions (p-type impurity ions in case of PMOS transistors). A trivalent dopant such as boron (B) may be used as the p-type impurity ions.

According to another exemplary embodiment, the embedded circuit semiconductor layer 105 may include monocrystalline silicon, low-temperature polycrystalline silicon, amorphous silicon, or an oxide semiconductor. The oxide semiconductor may include, for example, a binary compound (ABx), a ternary compound (ABxCy), and a quaternary compound (ABxCyDz) containing indium (In), zinc (Zn), gallium (Ga), tin (Sn), titanium (Ti), aluminum (Al), hafnium (Hf), zirconium (Zr), magnesium (Mg), etc.

In the exemplary embodiment illustrated in FIG. 7, the embedded circuit semiconductor layer 105 may include indium tin zinc oxide (ITZO) or indium gallium zinc oxide (IGZO) as the oxide semiconductor.

A first insulating layer 111 may be disposed on the embedded circuit semiconductor layer 105. In some exemplary embodiments, the first insulating layer 111 may be disposed on the whole surface of the base substrate 101. The first insulating layer 111 may serve as a gate insulator. The first insulating layer 111 may include a silicon compound, a metal oxide, etc. For example, the first insulating layer 111 may include silicon oxide, silicon nitride, silicon oxynitride, aluminum oxide, tantalum oxide, hafnium oxide, zirconium oxide, titanium oxide, etc. They may be used alone or any combination to form the first insulating layer 111.

A first conductive layer 120 may be disposed on the first insulating layer 111. The first conductive layer 120 may include the gate electrode GE1 of the demux transistor of the embedded circuit disposed in the display area DA, the first fan-out line 71, and the second fan-out line 72.

The first conductive layer 120 may include at least one metal selected from the group including: molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W), and copper (Cu). The first conductive layer 120 may include a single layer or multiple layers of the above-listed materials.

A second insulating layer 112 may be disposed on the first conductive layer 120. The second insulating layer 112 may be disposed on the whole surface of the base substrate 101. The second insulating layer 112 may be selected from among the above-listed materials of the first insulating layer 111.

A second conductive layer 140 may be disposed on the second insulating layer 112. In some exemplary embodiments, the second insulating layer 112 may insulate the first conductive layer 120 from the second conductive layer 140. The second conductive layer 140 may include the first connection electrode 141 disposed in the pad portion PP, the second connection electrode 143 disposed in the contact portion CP, and the source electrode 145 and the drain electrode 147 that are disposed in the display area DA.

The first connection electrode 141 may be electrically connected to the first fan-out line 71 through a (1-1) contact hole CNT11 that penetrates through the second insulating layer 112 in the thickness direction Z. The second connection electrode 143 may be electrically connected to the second fan-out line 72 through the (2-1) contact hole CNT21 that penetrates through the second insulating layer 112 in the thickness direction Z.

The source electrode 145 and the drain electrode 147 may pass through the second insulating layer 112 in the thickness direction Z to be connected to the source region and the drain region of the embedded circuit semiconductor layer 105, respectively.

The gate electrode GE1, and the source electrode 145, and the drain electrode 147 of the embedded circuit semiconductor layer 105 may form an embedded circuit transistor, e.g., a demux transistor.

The second conductive layer 140 may include at least one selected from the group including: molybdenum (Mo), aluminum (Al), germanium (Ge), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W), and copper (Cu). The second conductive layer 140 may be made up of a single layer of one of the above-listed materials. It is, however, to be understood that the present disclosure is not limited thereto. The second conductive layer 140 may include a stack of multiple layers. For example, the second conductive layer 140 may have a stack structure of Ti/Al/Ti, Mo/Al/Mo, Mo/AlGe/Mo, Ti/Cu, etc.

The interlayer dielectric layer 150 may be disposed on the first circuit portion CCP1. In some exemplary embodiments, the interlayer dielectric layer 150 may be disposed directly on the second conductive layer 140 and cover the second conductive layer 140. The interlayer dielectric layer 150 can be used to insulate the conductive layers and the semiconductor layers of the first circuit portion CCP1 and the second circuit portion CCP2 from one another. In addition, the interlayer dielectric layer 150 can support the plurality of elements of the second circuit portion CCP2 disposed thereon.

The interlayer dielectric layer 150 may include multiple layers. For example, an insulating material included in the interlayer dielectric layer 150 may include an inorganic insulating material or an organic insulating material. The inorganic insulating material may include silicon oxide, silicon nitride, silicon oxynitride, aluminum oxide, tantalum oxide, hafnium oxide, zirconium oxide, titanium oxide, etc. These inorganic insulating materials may be used alone or in combinations. The organic insulating material may include at least one of: polyacrylate resin, epoxy resin, phenolic resin, polyamide resin, polyimide resin, unsaturated polyesters resin, polyphenylene ethers resin, polyphenylene sulfides resin, benzocyclobutene (BCB), etc.

Referring to FIG. 7, the interlayer dielectric layer 150 is shown to include an organic insulating material for convenience of illustration. The interlayer dielectric layer 150 including an organic insulating material may work as a planarization layer that provides a flat upper surface.

Hereinafter, the second circuit portion CCP2 will be described. The second circuit portion CCP2 may include the pixel 1 (see FIG. 7). That is, the second circuit portion CCP2 may include the transistors and the organic light-emitting diode OLED of the pixel 1 described above with reference to FIG. 3.

The stack structure of the second circuit portion CCP2 will be described. The second circuit portion CCP2 includes a plurality of conductive layers disposed on the interlayer dielectric layer 150 and a plurality of insulating layers disposed between the plurality of conductive layers.

A pixel semiconductor layer 155 may be disposed on the interlayer dielectric layer 150. The pixel semiconductor layer 155 may form a channel of the first to seventh transistors T1 to T7 of the pixel 1 (see FIG. 3). For convenience of illustration, only one of transistors included in the pixel 1 is illustrated in FIG. 7 as an example.

The pixel semiconductor layer 155 may be disposed in each of the pixels 1 in the display area DA. The pixel semiconductor layer 155 may include a source region, a drain region, and an active region. The pixel semiconductor layer 155 may include polycrystalline silicon. According to another exemplary embodiment, the pixel semiconductor layer 155 may include monocrystalline silicon, low-temperature polycrystalline silicon, amorphous silicon, or an oxide semiconductor.

In some exemplary embodiments, the pixel semiconductor layer 155 may overlap the embedded circuit semiconductor layer 105 in the thickness direction Z.

In some exemplary embodiments, the embedded circuit semiconductor layer 105 and the pixel semiconductor layer 155 may include the same material. For example, the embedded circuit semiconductor layer 105 and the pixel semiconductor layer 155 may include the same polycrystalline silicon. Alternatively, in some exemplary embodiments, the embedded circuit semiconductor layer 105 and the pixel semiconductor layer 155 may include different materials. For example, the embedded circuit semiconductor layer 105 may include an oxide semiconductor, and the pixel semiconductor layer 155 may include a polycrystalline silicon. In another exemplary embodiment, the embedded circuit semiconductor layer 105 may include a polycrystalline silicon, and the pixel semiconductor layer 155 may include an oxide semiconductor.

A third insulating layer 161 may be disposed on the pixel semiconductor layer 155. The third insulating layer 161 may be disposed on the whole surface of the interlayer dielectric layer 150. The third insulating layer 161 may serve as a gate insulator. In some exemplary embodiments, the third insulating layer 161 may include the same material as the first insulating layer 111 or may include one of the inorganic insulating materials listed above as examples of the first insulating layer 111.

A third conductive layer 170 may be disposed on the third insulating layer 161. The third conductive layer 170 may include gate electrodes of the first to seventh transistors T1 to T7 of the pixel 1 disposed in the display area DA, and the first electrode CE1 of the storage capacitor Cst (see FIG. 3). One gate electrode GE2 of the gate electrodes of the first to seventh transistors T1 to T7 of the pixel 1 is illustrated in FIG. 7 as an example. In some exemplary embodiments, the gate electrode GE2 may be, but is not limited to, the gate electrode of the seventh transistor T7 (see FIG. 3) of the pixel 1.

The third conductive layer 170 may include at least one metal selected from the group including: molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W), and copper (Cu). The third conductive layer 170 may include a single layer or multiple layers of the above-listed materials.

A fourth insulating layer 162 may be disposed on the third conductive layer 170. The fourth insulating layer 162 may be disposed on the whole surface of the interlayer dielectric layer 150. The fourth insulating layer 162 may be selected from among the above-listed materials of the third insulating layer 161.

A fourth conductive layer 180 may be disposed on the fourth insulating layer 162. The fourth insulating layer 162 may insulate the third conductive layer 170 from a fourth conductive layer 180. The fourth conductive layer 180 may include a second electrode CE2 of the storage capacitor Cst (see FIG. 3). The fourth conductive layer 180 may be selected from among the above-listed materials of the third conductive layer 170.

A fifth insulating layer 163 may be disposed on the fourth conductive layer 180. The fifth insulating layer 163 may include at least one of the above-listed materials of the third insulating layer 161. In some exemplary embodiments, the fifth insulating layer 163 may include an organic insulating material.

A fifth conductive layer 190 may be disposed on the fifth insulating layer 163. The fifth conductive layer 190 may include a pad PAD disposed in the pad portion PP, a data line DL, a pixel source electrode 191, and a pixel drain electrode 193. A (1-2) contact hole CNT12 and a (2-2) contact hole CNT22 may be formed to penetrate through the interlayer dielectric layer 150, the third insulating layer 161, the fourth insulating layer 162, and the fifth insulating layer 163 in the thickness direction Z in the pad portion PP and in the contact portion CP, respectively.

The pad PAD may overlap the first connection electrode 141 of the first circuit portion CCP1 described above in the thickness direction Z and may be connected to the first connection electrode 141 through the (1-2) contact hole CNT12. The data line DL may overlap the second connection electrode 143 of the first circuit portion CCP1 in the thickness direction Z and may be connected to the second connection electrode 143 through the (2-2) contact hole CNT22. In addition, the data line DL may be electrically connected to the pixel source electrode 191 that is connected to the source region of the pixel semiconductor layer 155. In some exemplary embodiments, the data line DL and the pixel source electrode 191 may be indirectly connected with each other but may be electrically connected to each other through a separate line or a separate transistor. The pixel drain electrode 193 may be connected to the drain region of the pixel semiconductor layer 155.

The gate electrode GE2, the pixel semiconductor layer 155, the pixel source electrode 191, and the pixel drain electrode 193 may form a thin-film transistor. The thin-film transistor may correspond to one of the transistors T1, T2, T3, T4, T5, T6, and T7 included in the pixel 1 described above with reference to FIG. 3. For example, the thin-film transistor may be the seventh transistor T7 or the sixth transistor T6 shown in FIG. 3 that is connected to the anode electrode ANO of the organic light-emitting diode OLED.

The fifth conductive layer 190 may include at least one selected from the group including: molybdenum (Mo), aluminum (Al), germanium (Ge), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W), and copper (Cu). The fifth conductive layer 190 may include a single layer of one of the above-listed materials. It is, however, to be understood that the present disclosure is not limited thereto. The fifth conductive layer 190 may include a stack of multiple layers. For example, the fifth conductive layer 190 may have a stack structure of Ti/Al/Ti, Mo/Al/Mo, Mo/AlGe/Mo, Ti/Cu, etc.

A sixth insulating layer 164 may be disposed on the fifth conductive layer 190. The sixth insulating layer 164 may include an organic insulating material.

The anode electrode ANO is disposed on the sixth insulating layer 164 in the display area DA. The anode electrode ANO may pass through the sixth insulating layer 164 to be electrically connected to the pixel drain electrode 193.

A bank layer BANK may be disposed on the anode electrode ANO. In some exemplary embodiments, the bank layer BANK may be disposed in the display area DA and may be further disposed in the contact portion CP. The bank layer BANK may include an opening via which the anode electrode ANO is exposed. The bank layer BANK may include an organic insulating material. For example, the bank layer BANK may include at least one of a photoresist, a polyimide resin, an acrylic resin, a polyacrylic resin, and the like.

The organic layer OL may be disposed on the upper surface of the anode electrode ANO and the opening of the bank layer BANK. The organic layer OL may include an organic light-emitting layer and may emit light of a certain color. For example, the light emitted by the organic layer OL may be one of red light, green light, and blue light.

The cathode electrode CAT is disposed on the organic layer OL and the bank layer BANK. The cathode electrode CAT may be a common electrode disposed across the plurality of pixels 1.

The anode electrode ANO, the organic layer OL, and the cathode electrode CAT may form the organic light-emitting diode OLED.

A thin-film encapsulation layer TFE is disposed on the cathode electrode CAT. The thin-film encapsulation layer TFE may be disposed across the display area DA and the contact portion CP. The thin-film encapsulation layer TFE may cover the organic layer OL. The thin-film encapsulation layer TFE may include a stacked layer including one or more inorganic layers and one or more organic layers alternately stacked on one another. For example, the thin-film encapsulation layer TFE may include a first inorganic encapsulation film TFE1, an organic encapsulation film TFE2, and a second inorganic encapsulation film TFE3 stacked on one another in this order. In some exemplary embodiments, the organic encapsulation film TFE2 may be located closer to the organic light-emitting diode OLED than the second inorganic encapsulation film TFE3, and the second inorganic encapsulation film TFE3 covers a side surface of the organic encapsulation film TFE2 and may be in direct contact with the upper surface of the first inorganic encapsulation film TFE1, as shown in FIG. 7. The stacked structure of the thin-film encapsulation layer TFE prevents the organic encapsulation film TFE2 from flowing to the outside.

In some exemplary embodiments, the thin-film encapsulation layer TFE may not be disposed in the pad portion PP.

In the display device 10 according to the above-described exemplary embodiment, the embedded circuit or the demultiplexing circuit 60 (see FIGS. 1 and 7) and the pixel 1 (see FIGS. 1 and 7) may be disposed in the display area DA. That is, the embedded circuit may be included in the first circuit portion CCP1 disposed on a different layer from the second circuit portion CCP2. In this manner, the dead space of the display device 10 can be reduced. In some exemplary embodiments, the embedded circuit may overlap the pixel 1. For example, the demux transistor included in the demultiplexing circuit 60 may overlap the transistor included in the pixel 1 (see FIG. 7). In such case, the degree of integration of the display device 10 can be improved while reducing the dead space.

Hereinafter, display devices according to other exemplary embodiments of the present disclosure will be described. In the following description, the same or similar elements will be denoted by the same or similar reference numerals, and redundant descriptions will be omitted or briefly described.

Figure 8:
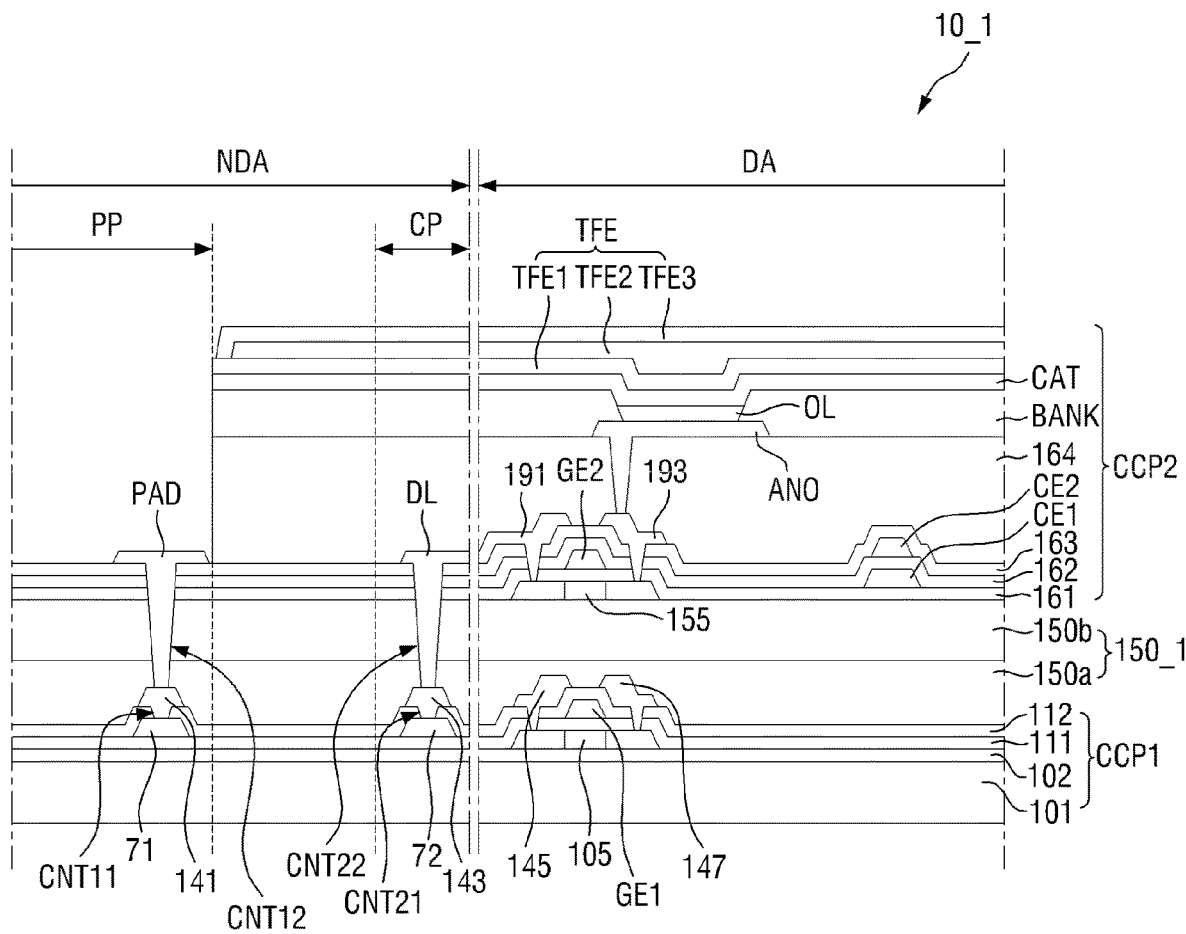
FIG. 8 is a cross-sectional view of a display device according to another exemplary embodiment of the present disclosure.

FIG. 8 is a cross-sectional view of a display device according to another exemplary embodiment of the present disclosure.

A display device 10_1 shown in FIG. 8 is substantially identical to the display device 10 according to the above exemplary embodiment except that an interlayer dielectric layer 150_1 includes multiple layers. Accordingly, the redundant description will be omitted, and description will focus on the differences of the interlayer dielectric layer 150_1 from the interlayer dielectric layer 150.

More specifically, the interlayer dielectric layer 150_1 of the display device 10_1 may include a first interlayer dielectric layer 150a and a second interlayer dielectric layer 150b disposed on the first interlayer dielectric layer 150a. The first interlayer dielectric layer 150a may be an inorganic interlayer dielectric layer having a polished surface, and the second interlayer dielectric layer 150b may be an organic interlayer dielectric layer including an organic material. The first interlayer dielectric layer 150a may be disposed on the second conductive layer 140 and may be in direct contact with the plurality of electrodes of the second conductive layer 140 and portions of the second insulating layer 112 that are exposed by the plurality of electrodes of the second conductive layer 140.

A (1-2) contact hole CNT12 and a (2-2) contact hole CNT22 may penetrate through the first interlayer dielectric layer 150a, the second interlayer dielectric layer 150b, the third insulating layer 161, the fourth insulating layer 162 and the fifth insulating layer 163 in the thickness direction Z.

As the interlayer dielectric layer 150_1 of the display device 10_1 includes the first interlayer dielectric layer 150a and the second interlayer dielectric layer 150b including different materials, the upper surface of the interlayer dielectric layer 150_1 may become flatter. As a result, elements the second circuit portion CCP2 can be more stably formed on the interlayer dielectric layer 150_1.

Figure 9:
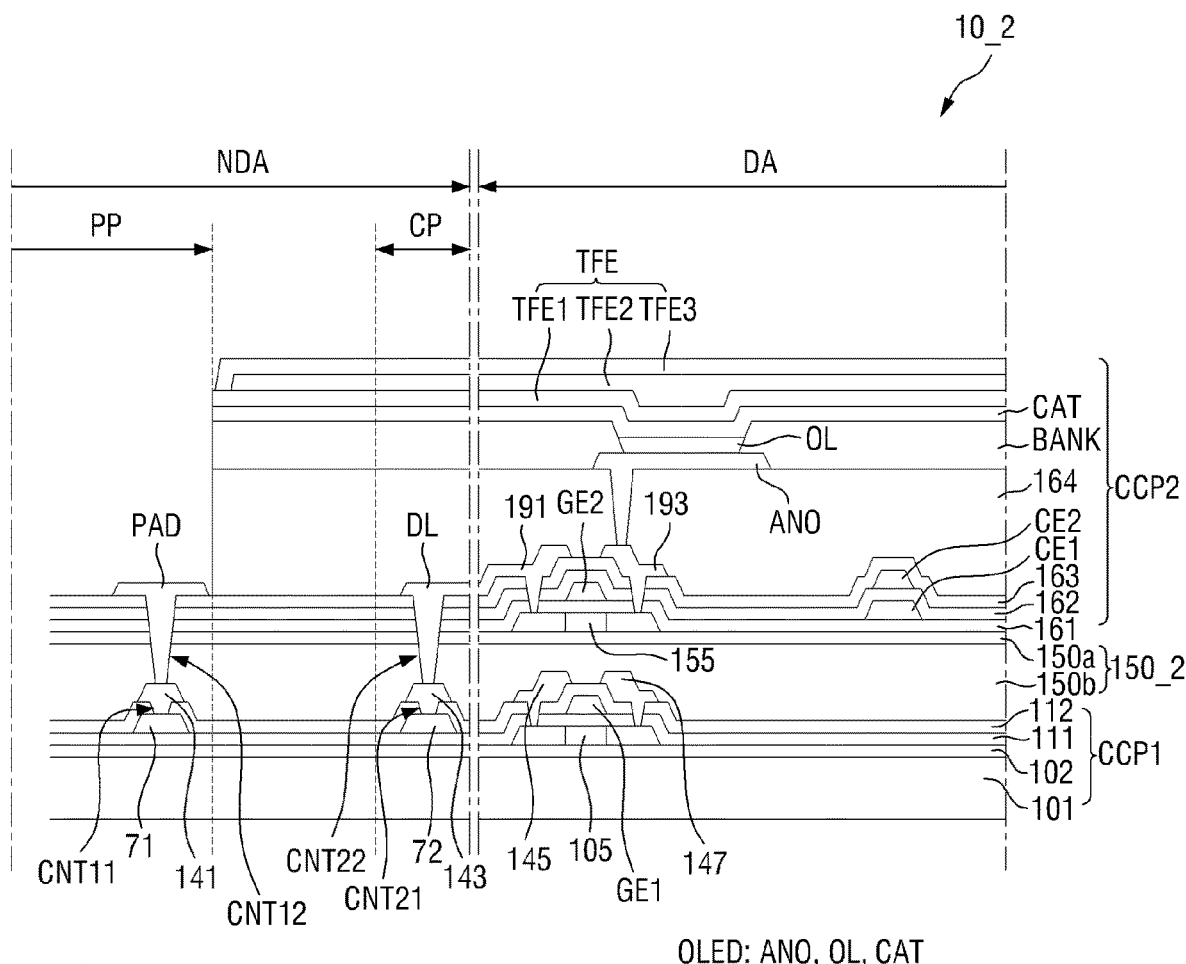
FIG. 9 is a cross-sectional view of a display device according to yet another exemplary embodiment of the present disclosure.

FIG. 9 is a cross-sectional view of a display device according to yet another exemplary embodiment of the present disclosure.

A display device 10_2 shown in FIG. 9 is substantially identical to the display device 10_1 shown in FIG. 8 except that the positions of a first interlayer dielectric layer 150a and a second interlayer dielectric layer 150b of an interlayer dielectric layer 150_2 are revered.

More specifically, the second first interlayer dielectric layer 150b including an organic insulating material may be disposed on the second conductive layer 140 and may be in direct contact with the plurality of electrodes of the second conductive layer 140 and portions of the second insulating layer 112 that are exposed by the plurality of electrodes of the second conductive layer 140. The first interlayer dielectric layer 150a including an inorganic insulating material may be disposed on the second interlayer insulating layer 150b, and the second circuit portion CCP2 may be disposed on the first interlayer dielectric layer 150a.

The other elements are identical to those describe above with reference to FIG. 7; and, therefore, the redundant description will be omitted.

Figure 10:
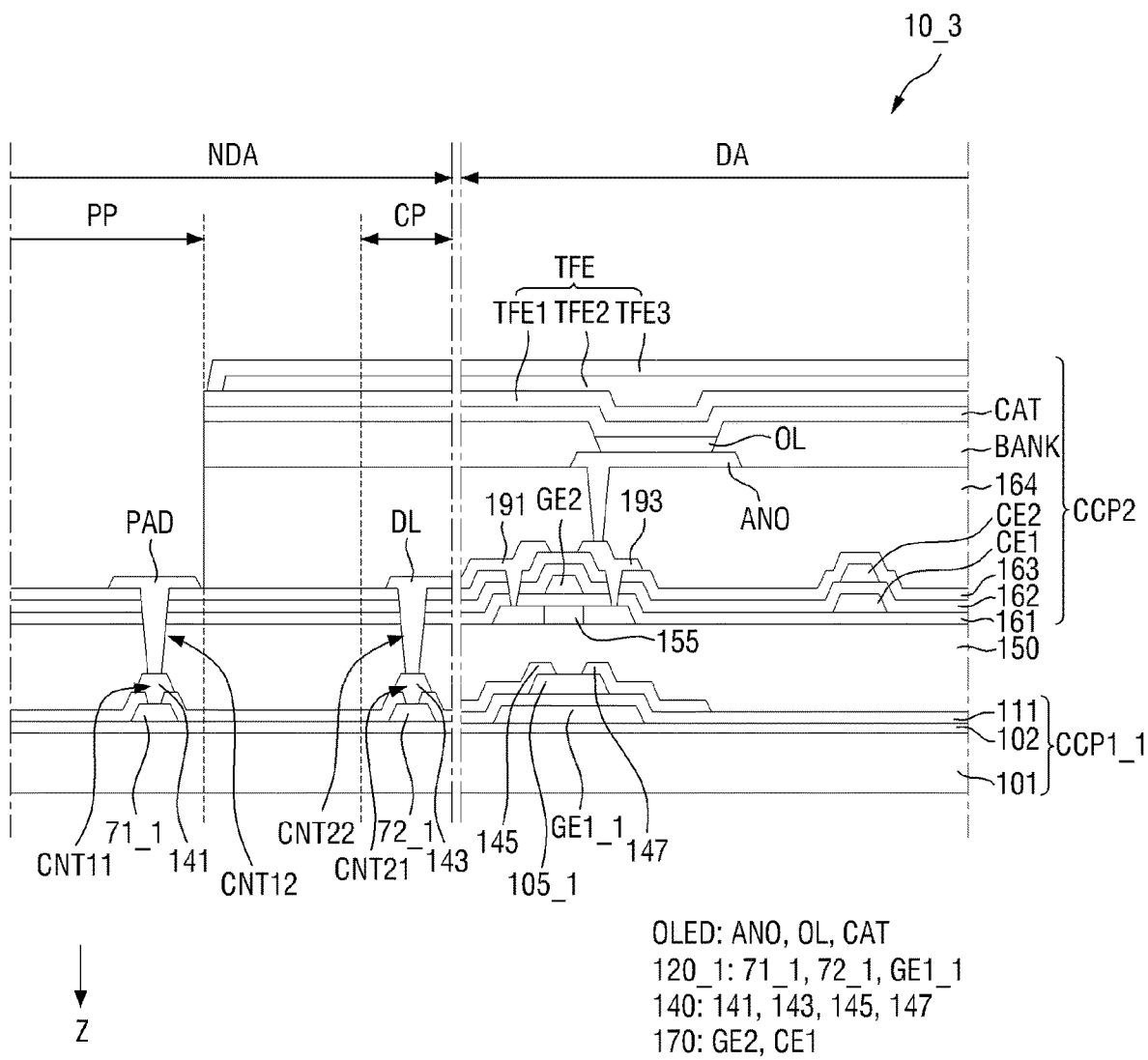
FIG. 10 is a cross-sectional view of a display device according to yet another exemplary embodiment of the present disclosure.

FIG. 10 is a cross-sectional view of a display device according to yet another exemplary embodiment of the present disclosure.

A display device 10_3 shown in FIG. 10 is substantially identical to the display device 10 shown in FIG. 7 except that the embedded circuit of a first circuit portion CCP1_1 has a bottom-gate structure.

More specifically, in the display device 10_3, a transistor (e.g., a demux transistor) included in the embedded circuit of the first circuit portion CCP_1 may be of a bottom gate type. That is, a first conductive layer 120_1 including a gate electrode GE1_1, a first fan-out line 71_1, and a second fan-out line 72_1 may be disposed on a buffer layer 102.

A first insulating layer 111 may be disposed on the first conductive layer 120_1, and an embedded circuit semiconductor layer 105_1 may be disposed on the first insulating layer 111. A (1-1) contact hole CNT11 exposing the first fan-out line 71_1 and a (2-1) contact hole CNT21 exposing the second fan-out line 72_1 may be formed to penetrate through the first insulating layer 111.

A second conductive layer 140 may be disposed on the embedded circuit semiconductor layer 105_1. As described above, the second conductive layer 140 may include a first connection electrode 141, a second connection electrode 143, a source electrode 145, and a drain electrode 147. The first connection electrode 141 is connected to the first fan-out line 71_1 through the (1-1) contact hole CNT11, and the second connection electrode 143 is connected to the second fan-out line 72_1 through the (2-1) contact hole CNT21. The source electrode 145 and the drain electrode 147 may be in contact with the embedded circuit semiconductor layer 105_1.

An interlayer insulating layer 150 may be disposed on the second conductive layer 140. A (1-2) contact hole CNT12 exposing the first connection electrode 141 and the (2-2) contact hole CNT22 exposing the second connection electrode 143 may be formed to penetrate the interlayer insulating layer 150.

A second circuit portion CCP2 may be disposed on the interlayer insulating layer 150. A pad PAD may be connected to the first connection electrode 141 through the (1-2) contact hole CNT12, and a data line DL may be connected to the second connection electrode 143 through the (2-2) contact hole CNT22.

The other elements are identical to those describe above with reference to FIG. 7; and, therefore, the redundant description will be omitted.

Figure 11:
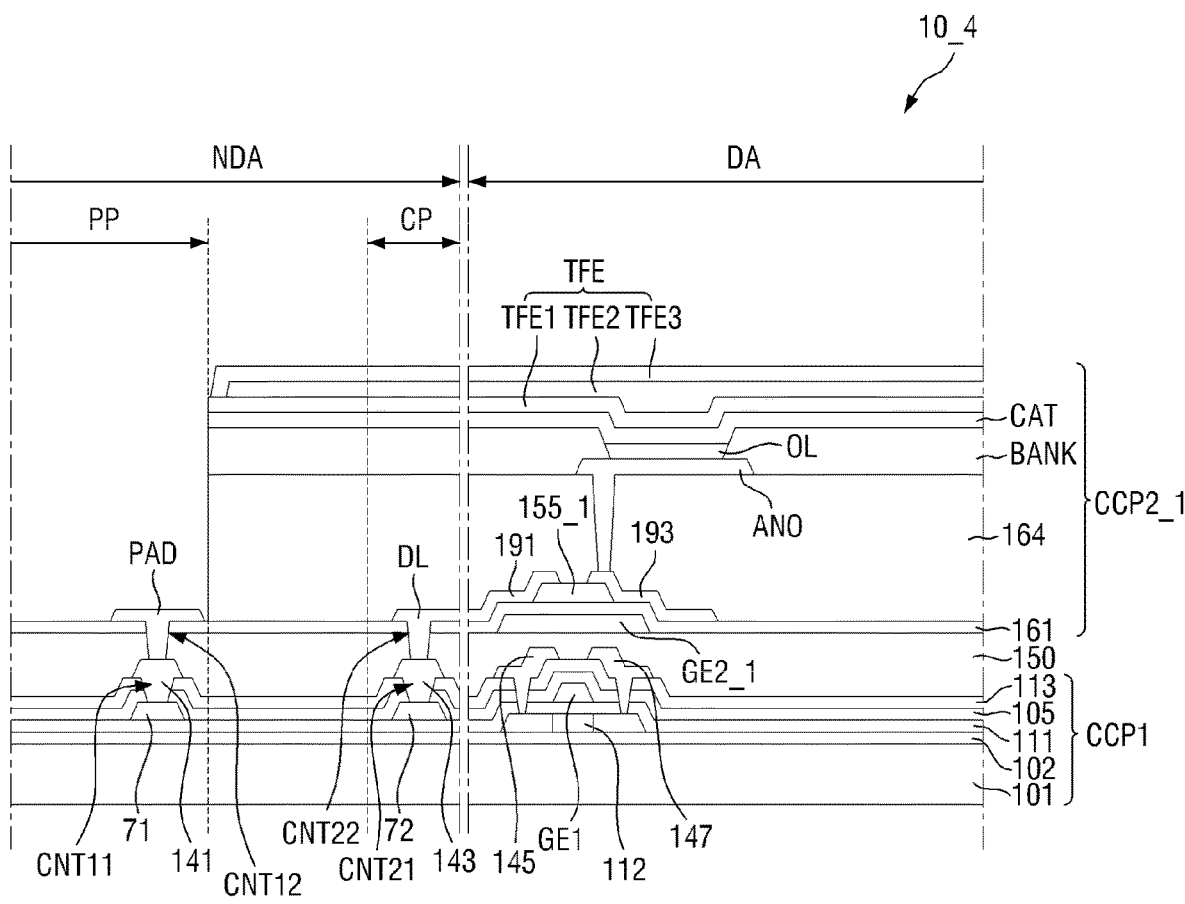
FIG. 11 is a cross-sectional view of a display device according to yet another exemplary embodiment of the present disclosure.

FIG. 11 is a cross-sectional view of a display device according to yet another exemplary embodiment of the present disclosure.

A display device 10_4 shown in FIG. 11 is substantially identical to the display device 10 shown in FIG. 7 except that a second circuit portion CCP2_1 includes a transistor of a bottom-gate type.

More specifically, a third conductive layer 170_1 including a gate electrode GE2_1 may be disposed on an interlayer insulating layer 150. As described above, the gate electrode GE2_1 may be a gate electrode of one of transistors included in a pixel 1.

A third insulating layer 161 may be disposed on the third conductive layer 170_1, and a pixel semiconductor layer 155_1 may be disposed on the third insulating layer 161.

A fourth conductive layer 190 including a pad PAD, a data line DL, a pixel source electrode 191, and a pixel drain electrode 193 may be disposed on the pixel semiconductor layer 155_1, and a sixth insulating layer 164 may be disposed on the fourth conductive layer 190.

A (1-2) contact hole CNT12 and a (2-2) contact hole CNT22 may be formed to penetrate through the interlayer insulating layer 150 and the third insulating layer 161.

The other elements are identical to those describe above with reference to FIG. 7; and, therefore, the redundant description will be omitted.

Figure 12:
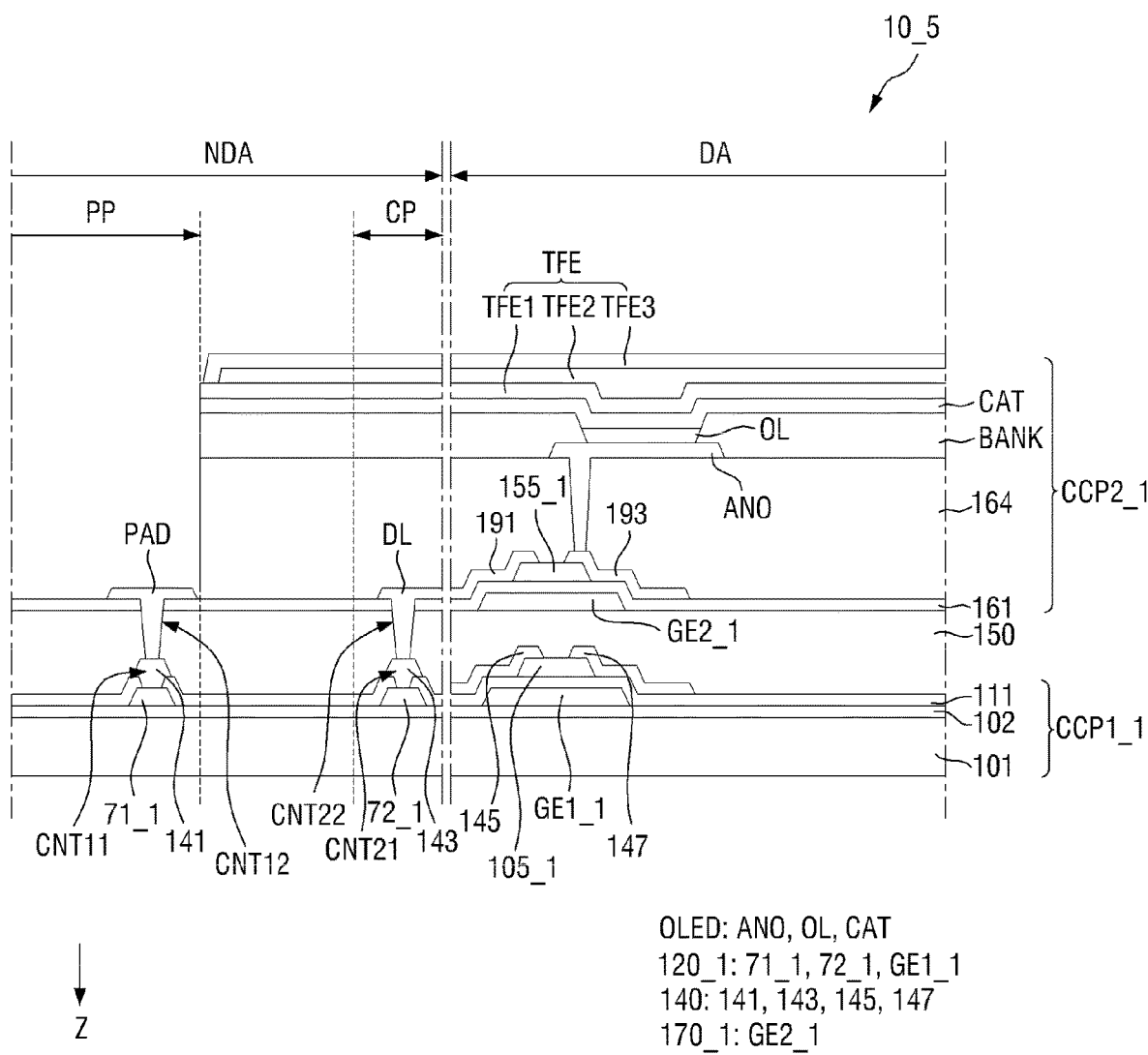
FIG. 12 is a cross-sectional view of a display device according to yet another exemplary embodiment of the present disclosure.

FIG. 12 is a cross-sectional view of a display device according to yet another exemplary embodiment of the present disclosure.

A display device 10_5 shown in FIG. 12 is substantially identical to the display device 10 shown in FIG. 7 except that a first circuit portion CCP1_1 and a second circuit portion CCP2_1 include transistors of a bottom-gate type.

The first circuit portion CCP_1_1 is identical to that described above with reference to FIG. 10, and the second circuit portion CCP2_1 is identical to that describe above with reference to FIG. 11. Therefore, the redundant description will be omitted.

Figure 13:
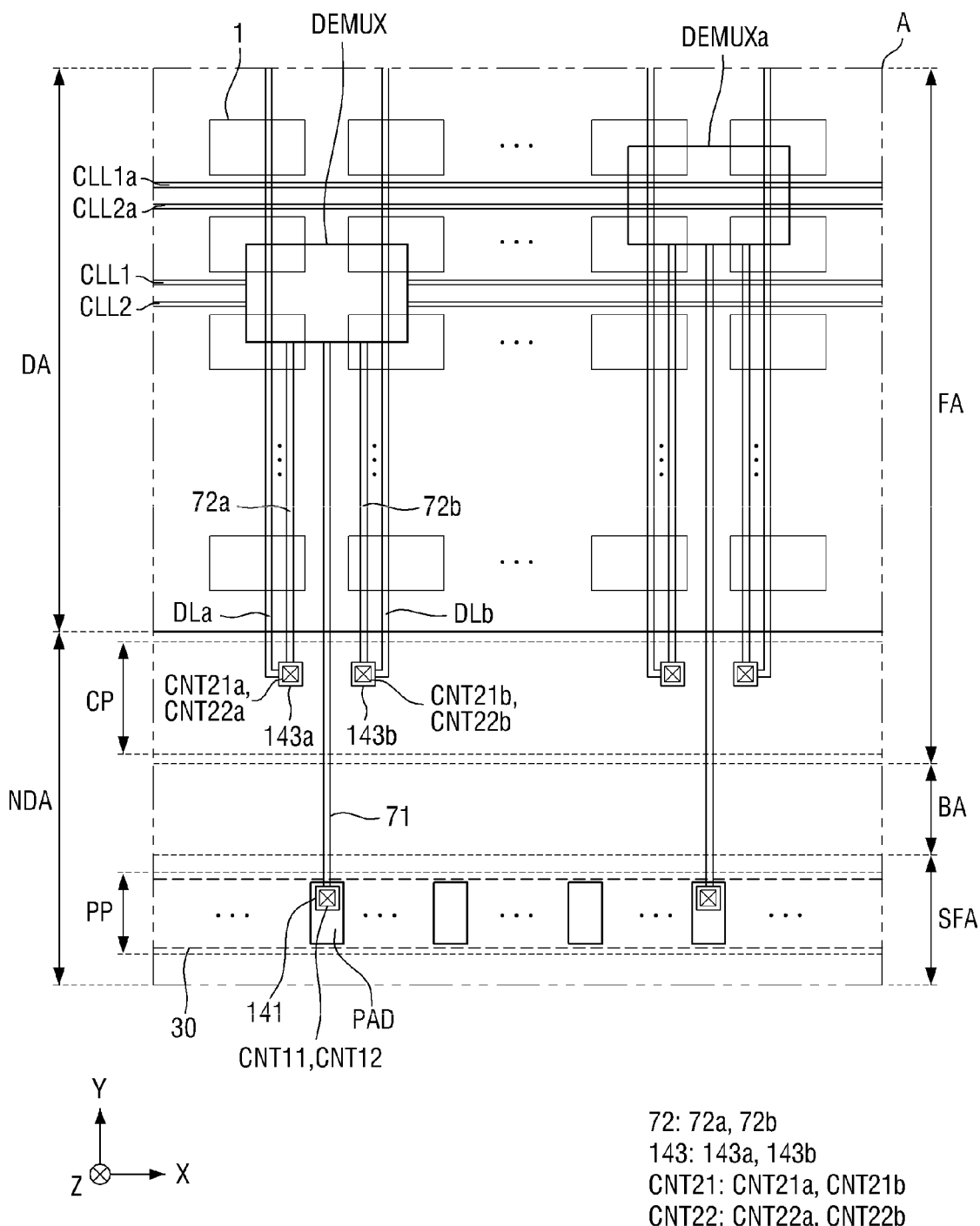
FIG. 13 is an enlarged view of a part of a display device according to yet another exemplary embodiment of the present disclosure.

FIG. 13 is an enlarged view of a part of a display device according to yet another exemplary embodiment of the present disclosure.

The display device shown in FIG. 13 is substantially identical to the display device shown in FIG. 6 except that the former further includes a demultiplexer DEMUXa in addition to the demultiplexer DEMUX.

As shown in FIG. 13, the demultiplexer DEMUXa may not be aligned with the demultiplexer DEMUX in the first direction X but may be located closer to the upper side in the second direction Y. It is, however, to be understood that the present disclosure is not limited thereto. Unlike the exemplary embodiment shown in FIG. 13, the demultiplexer DEMUXa may be located closer to the lower side in the second direction Y than the demultiplexer DEMUX.

While the demultiplexer DEMUX is connected to the first demux select signal line CLL1 and the second demux select signal CLL2, the demultiplexer DEMUXa may not be connected to the first demux select signal line CLL1 and the second demux select signal CLL2, but may be connected to different demux select signals including a first demux select signal line CLL1a and a second demux select signal line CLL2a.

For example, the first demux select signal line CLL1a and the second demux select signal line CLL2a may be located above the first demux select signal line CLL1 and the second demux select signal line CLL2 in the second direction Y.

Figure 14:
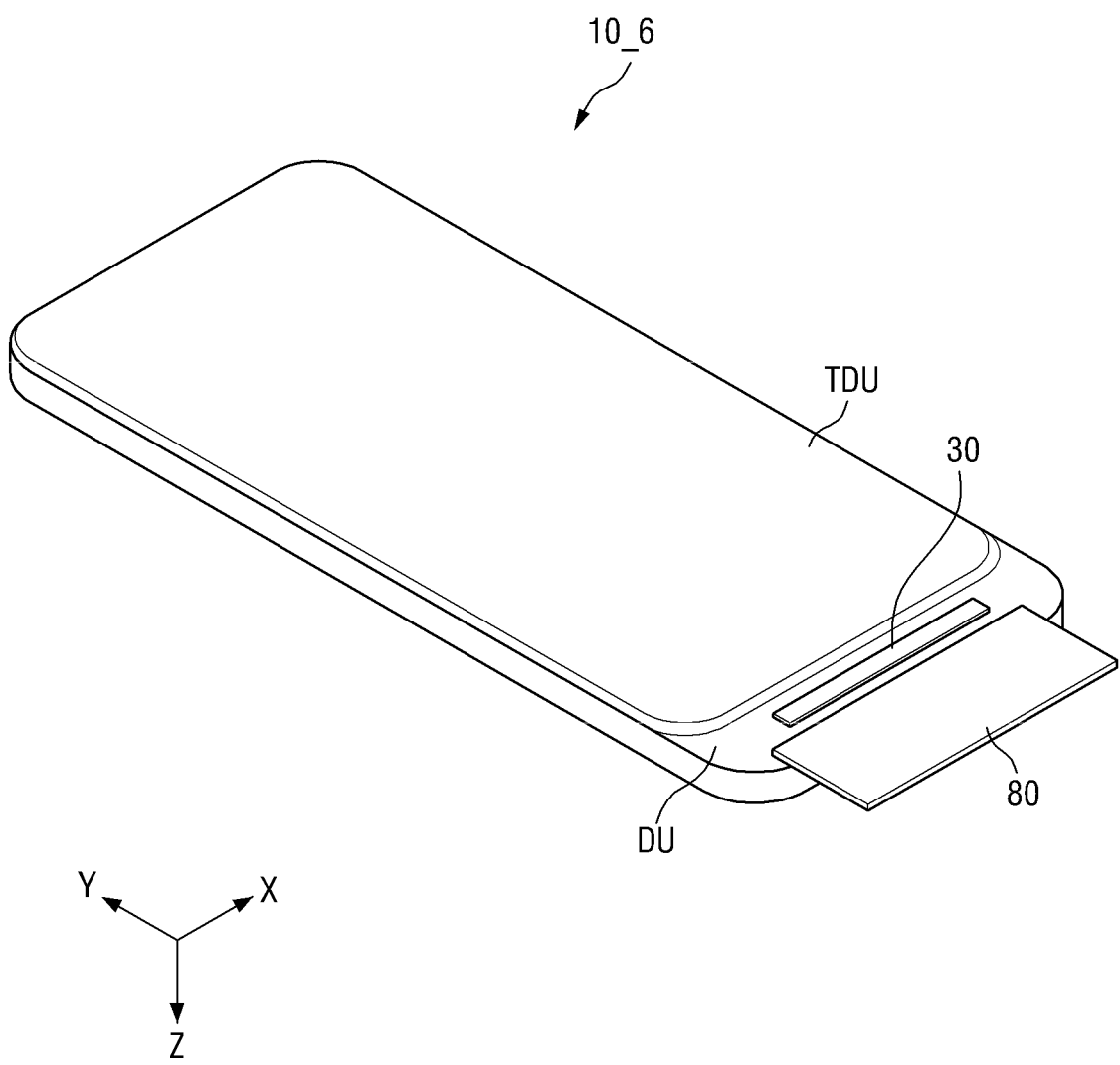
FIG. 14 is a perspective view of a display device according to yet another exemplary embodiment of the present disclosure.
Figure 15:
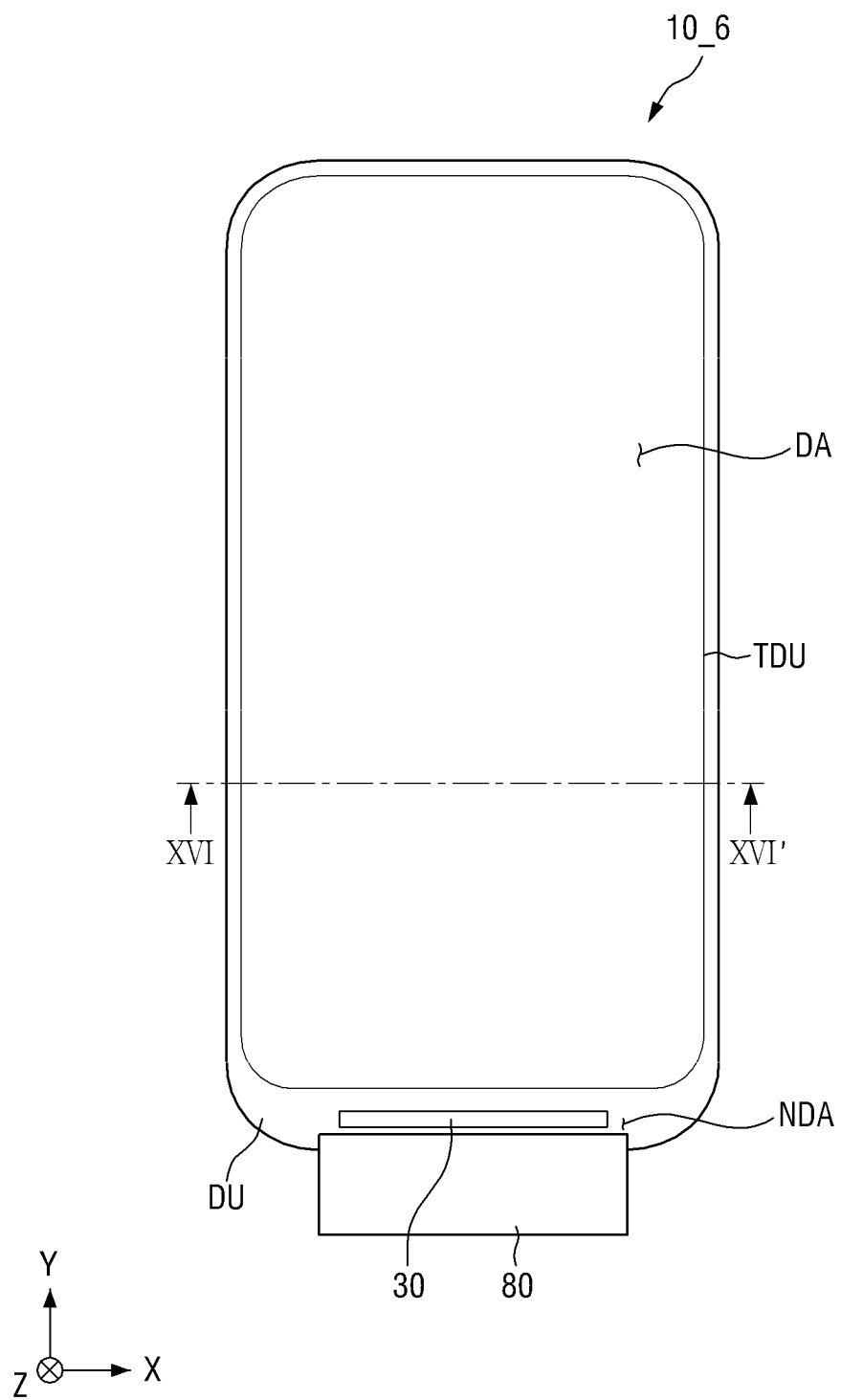
FIG. 15 is a plan view showing a display device according to yet another exemplary embodiment of the present disclosure.
Figure 16:
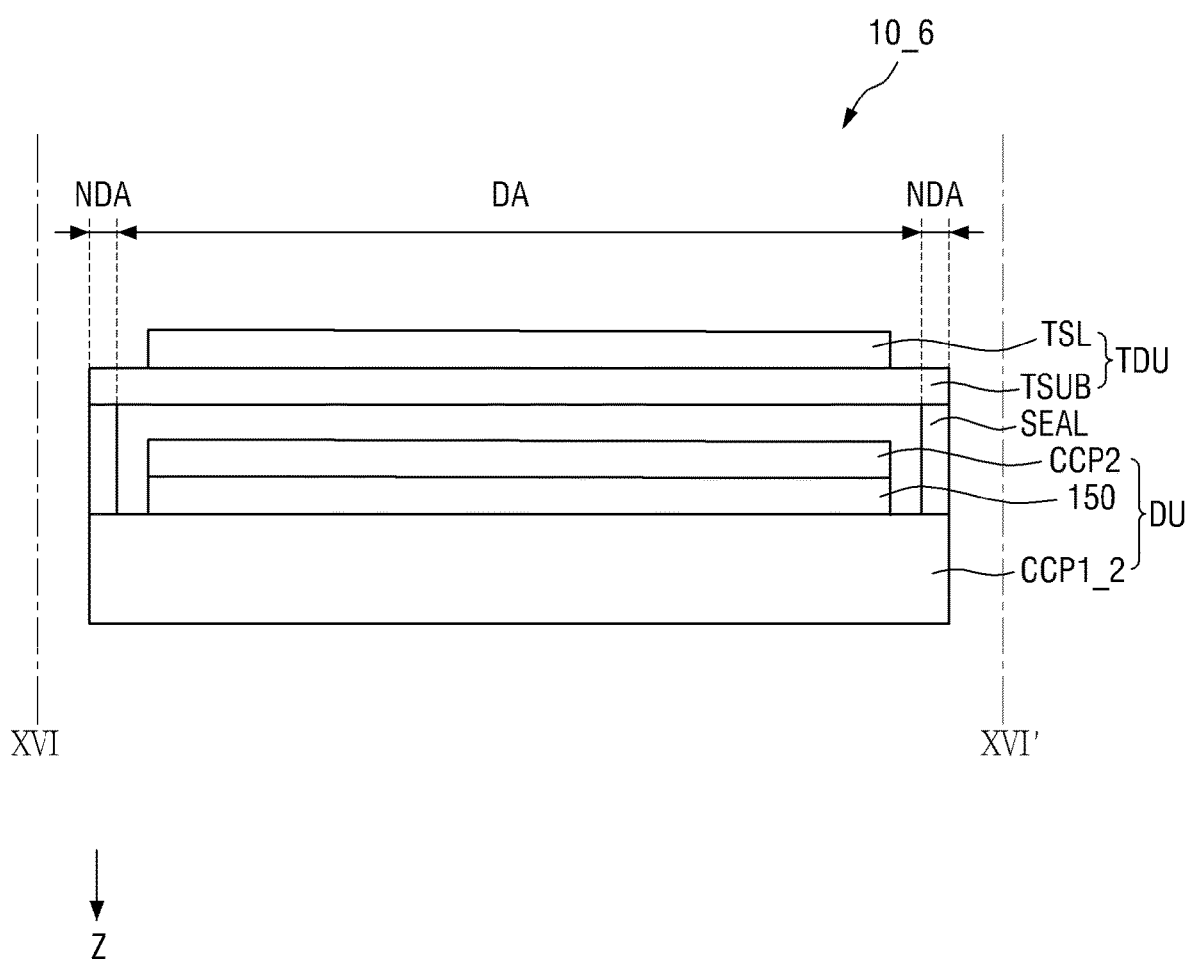
FIG. 16 is a cross-sectional view taken along line XVI-XVI' shown in FIG. 15.

FIG. 14 is a perspective view of a display device according to yet another exemplary embodiment of the present disclosure. FIG. 15 is a plan view showing a layout of a display device according to yet another exemplary embodiment of the present disclosure. FIG. 16 is a cross-sectional view taken along line XVI-XVI' shown in FIG. 15.

A display device 10_6 according to the exemplary embodiment shown in FIGS. 14 to 16 is substantially identical to the display device 10 according to the above exemplary embodiment except that a rigid substrate is employed in the display device 10_6.

More specifically, the display device 10_6 may include a display unit DU, a touch unit TDU, and a sealing member SEAL for sealing side surfaces of the display unit DU and the touch unit TDU.

The display unit DU may include a first circuit portion CCP1_2 and a second circuit portion CCP2 that include rigid substrates including rigid glass or quartz, and an interlayer dielectric layer 150 that is disposed between the first circuit portion CCP1_2 and the second circuit portion CCP2. The first circuit portion CCP1_2 has substantially the same configuration as the first circuit portion CCP1 described above except that a base substrate 101 shown in FIG. 7 may include a rigid material; and, therefore, the redundant description will be omitted.

The touch unit TDU may include a touch base substrate TSUB disposed on the display unit DU, and a touch sensor layer TSL disposed on the touch base substrate TSUB. The touch sensor layer TSL may include at least one touch conductive layer and at least one touch insulating layer. The touch conductive layer may include touch electrodes and touch lines.

In some exemplary embodiments, the touch base substrate TSUB may be an encapsulation substrate of the display device 10_6.

The sealing member SEAL may serve to seal the edges between the rigid substrate of the first circuit portion CCP1_2 and the touch base substrate TSUB when viewed from the top. According to some exemplary embodiments, the sealing member SEAL may include frit, etc.

The display device 10_6 may include a display area DA where images are displayed, a non-display area NDA located around the display area DA, like the display device 10 according to the exemplary embodiment described above. The sealing member SEAL may be disposed in the non-display area NDA of the display device 10_6.

In the display device 10_6, an embedded circuit and a pixel may be disposed in the display area DA. Specifically, the embedded circuit may be included in the first circuit portion CCP1_2 and disposed on a different layer from the second circuit portion CCP2 including the pixel, and the embedded circuit and the pixel may overlap each other in the display area DA. In this manner, the bezel width of the display device 10_6 can be reduced.

The embedded circuit and the pixel are identical to those described above with reference to FIGS. 1 to 7; and, therefore, the redundant description will be omitted.

Figure 17:
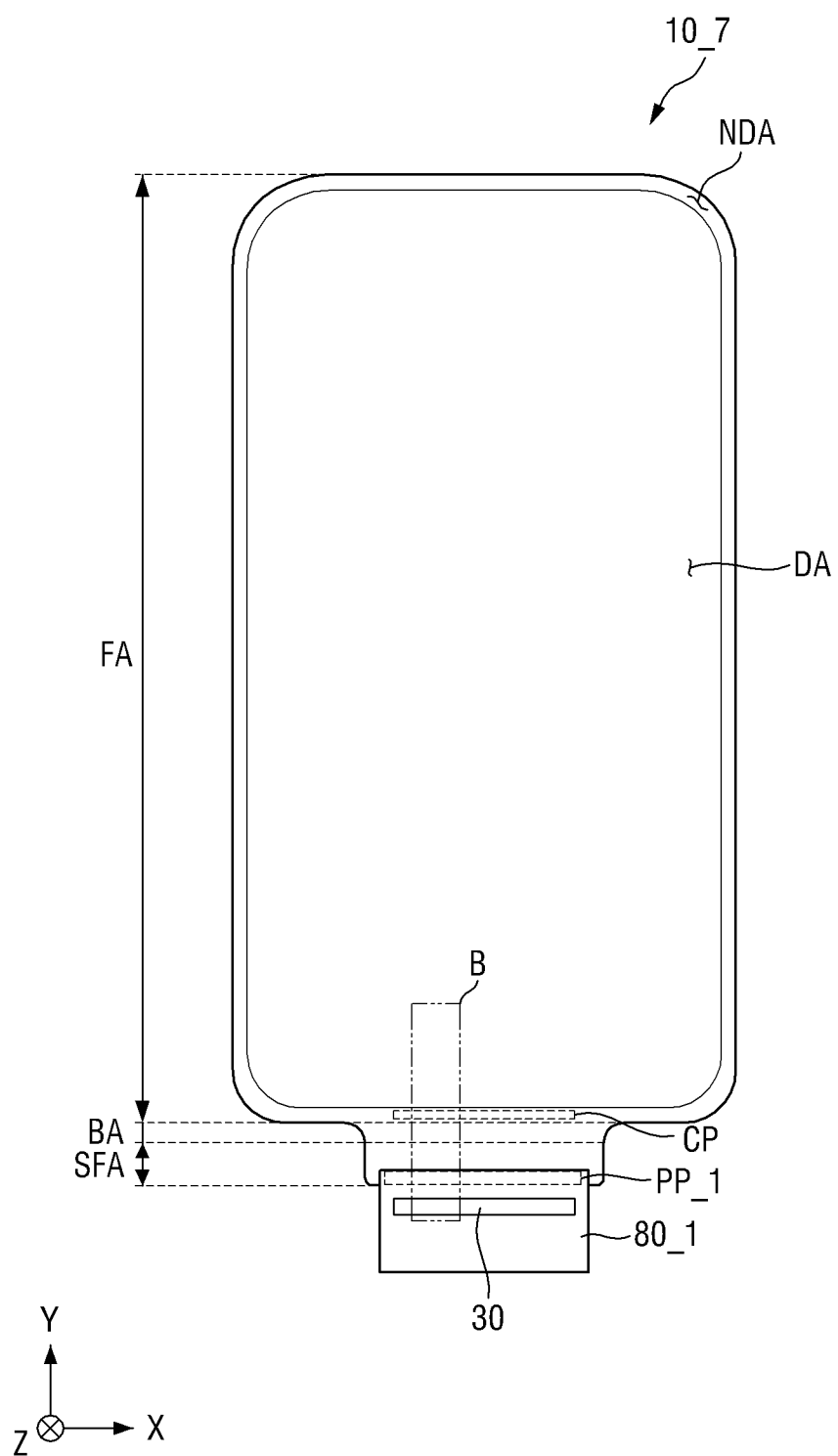
FIG. 17 is a plan view showing the layout of a display device according to yet another exemplary embodiment of the present disclosure.
Figure 18:
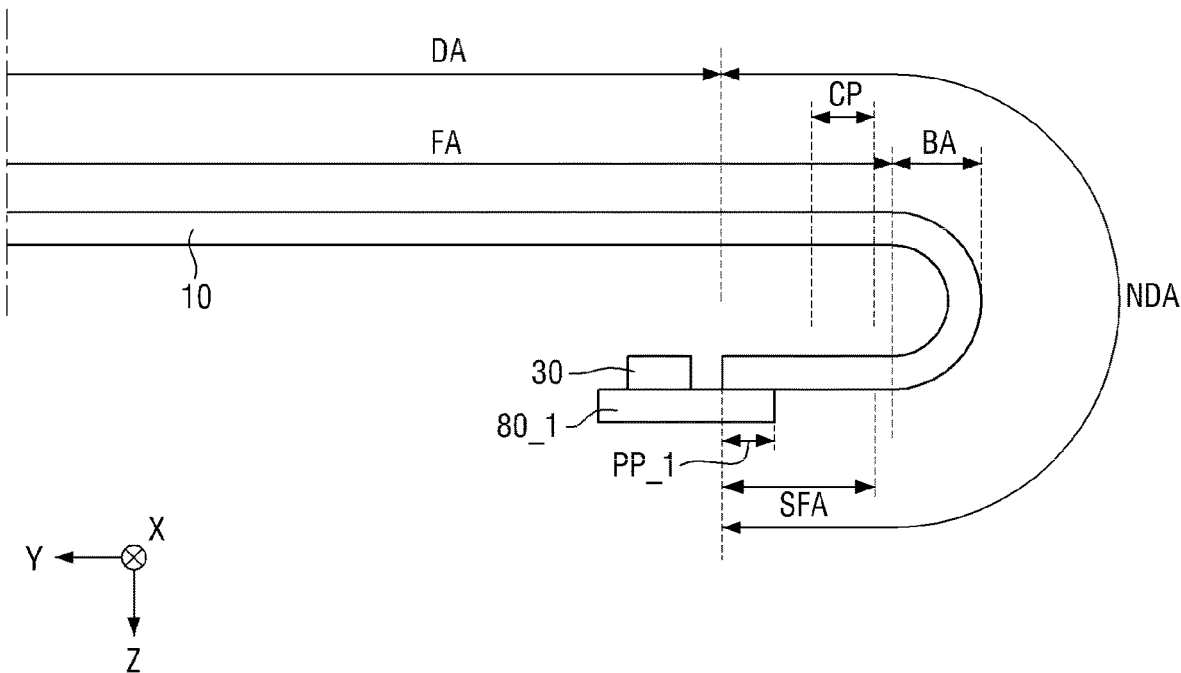
FIG. 18 is a schematic cross-sectional view of the display device shown in FIG. 17.
Figure 19:
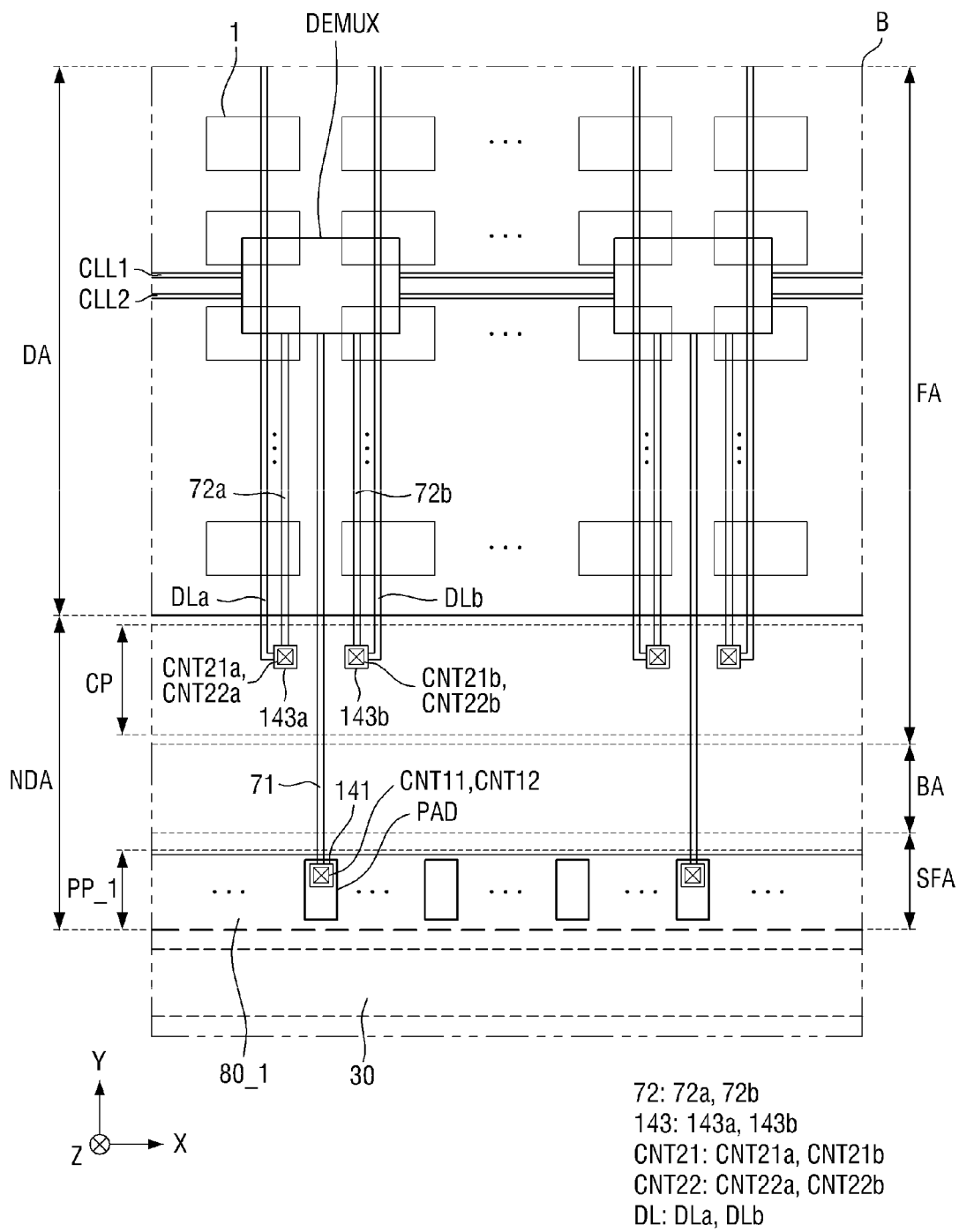
FIG. 19 is an enlarged view of portion B of FIG. 17.

FIG. 17 is a plan view showing a layout of a display device according to another exemplary embodiment of the present disclosure. FIG. 18 is a schematic cross-sectional view of the display device shown in FIG. 17. FIG. 19 is an enlarged view of portion B of FIG. 17.

A display device 10_7 according to the exemplary embodiment shown in FIGS. 17 to 19 is substantially identical to the display device 10 according to the above exemplary embodiment except that the data driver 30 shown in FIGS. 4 and 5 is mounted not on a second circuit layer CCP2 but on a printed circuit board 80_1.

More specifically, the data driver 30 according to this exemplary embodiment may be employed as a chip on a film mounted on the printed circuit board 80_1.

Referring to FIGS. 17 and 18, a pad portion PP_1 may refer to an area where the printed circuit board 80_1 is attached to the non-display area NDA of the display device 10_7.

The pad portion PP_1 is substantially identical to the pad portion PP of the display device 10 describe above with reference to FIGS. 5 to 7 except that the printed circuit board 80_1 is attached instead of the data driver 30.

Figure 20:
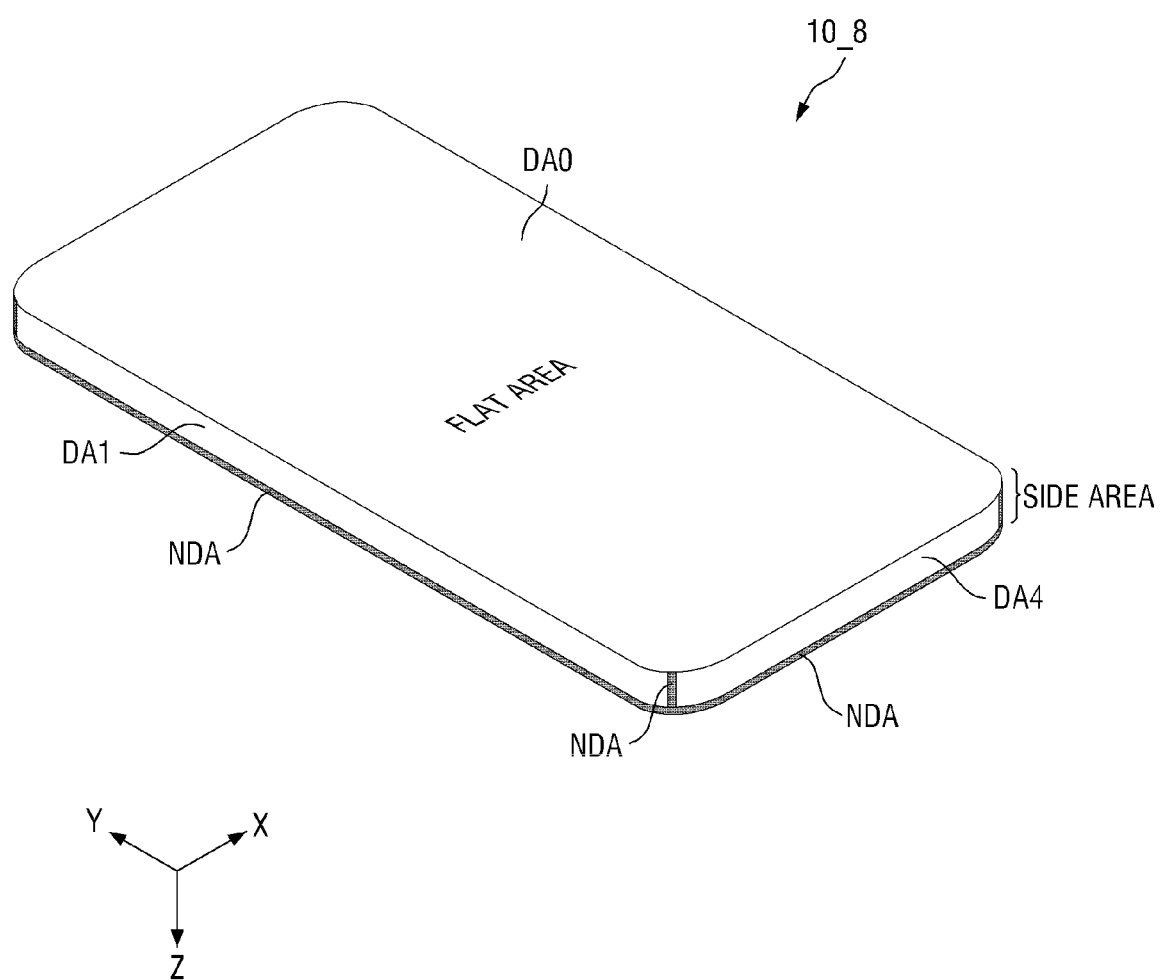
FIG. 20 is a perspective view of a display device according to yet another exemplary embodiment of the present disclosure.
Figure 21:
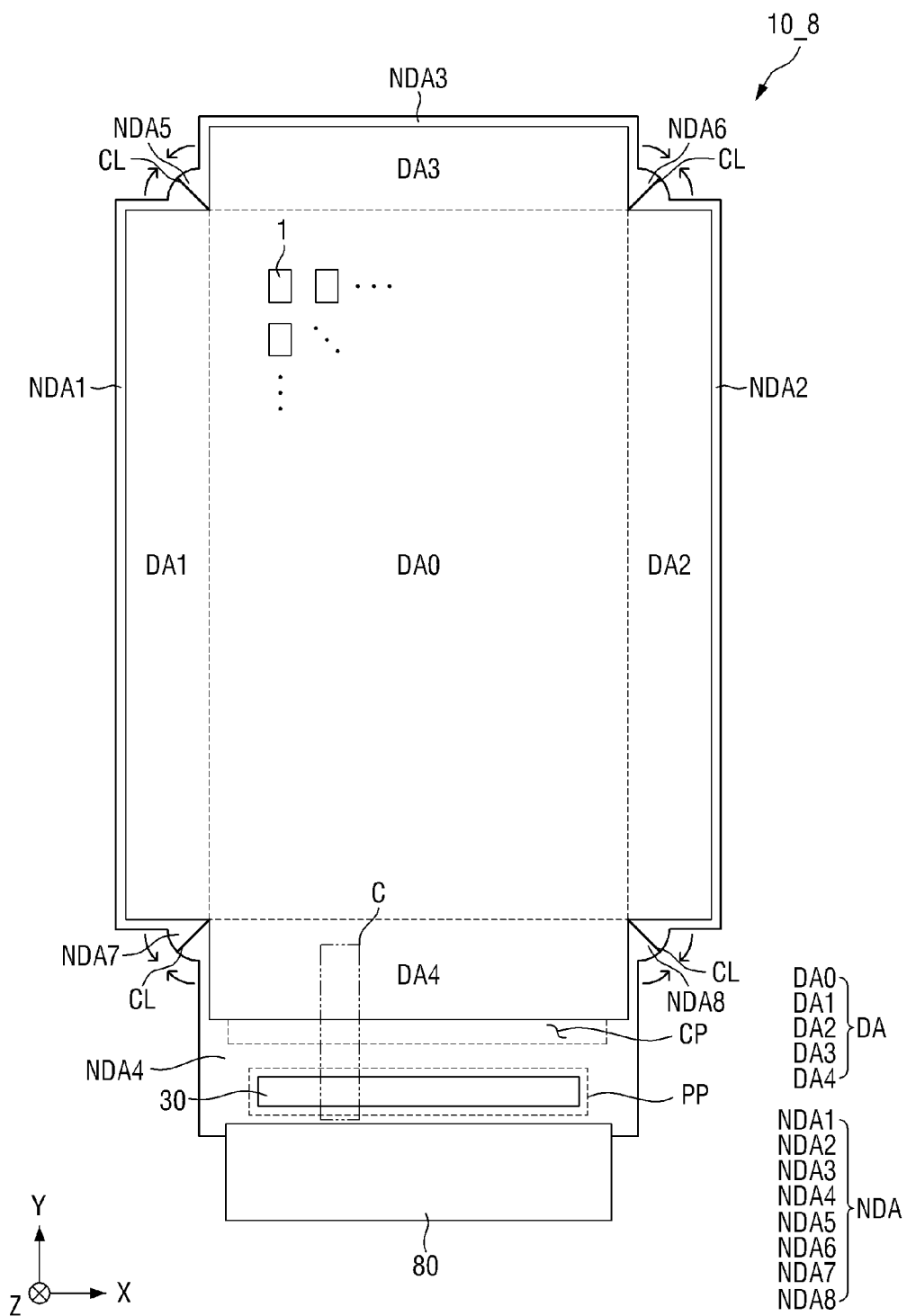
FIG. 21 is a development view of the display device of FIG. 20.
Figure 22:
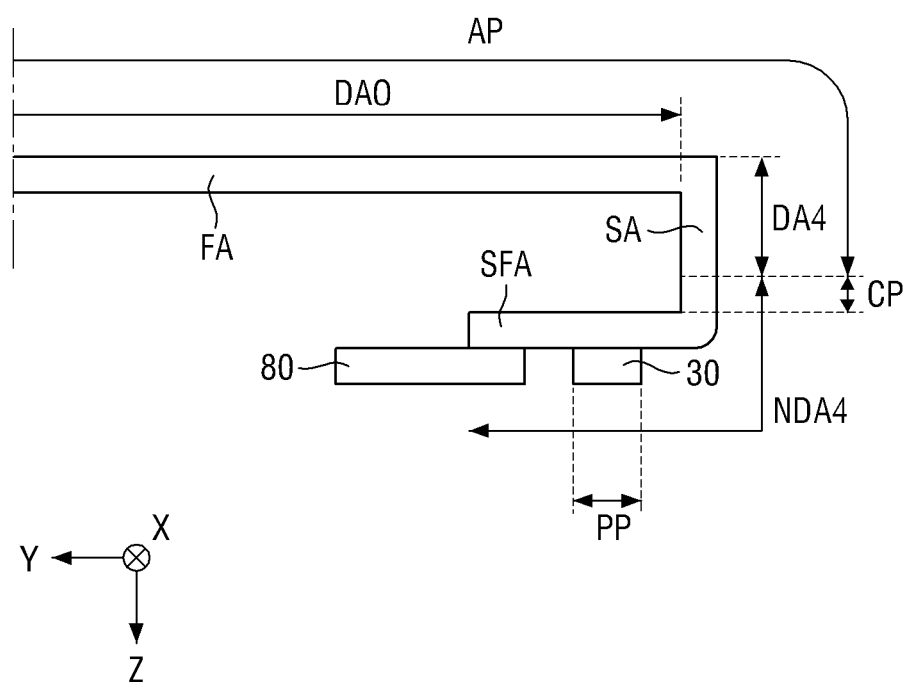
FIG. 22 is a schematic cross-sectional view of the display device of FIG. 20.
Figure 23:
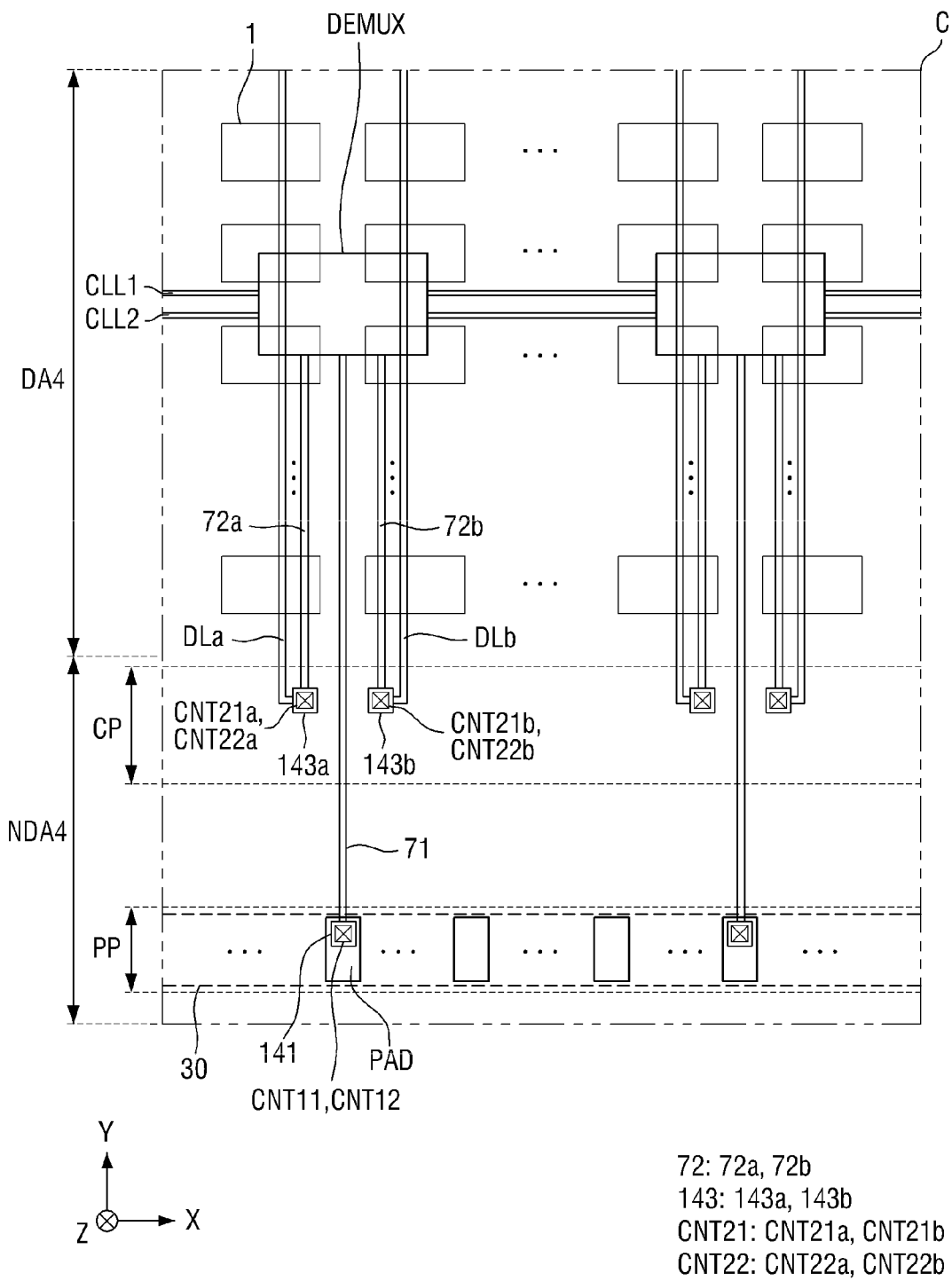
FIG. 23 is an enlarged view of area C of FIG. 21.

FIG. 20 is a perspective view of a display device according to yet another exemplary embodiment of the present disclosure. FIG. 21 is a development view of the display device of FIG. 20. FIG. 22 is a schematic cross-sectional view of the display device of FIG. 20. FIG. 23 is an enlarged view of area C of FIG. 21.

A display device 10_8 according to the exemplary embodiment shown in FIGS. 20 to 23, a display area DA may include a main display area DA0 and first to fourth subsidiary display areas DA1 to DA4. The main display area DA0 may correspond to a flat area FA of the display device 10_8, and the first subsidiary display area DA1, the second subsidiary display area DA2, the third subsidiary display area DA3, and the fourth subsidiary display area DA4 may be located on side areas SA of the display device 10_8. The side areas SA may be located substantially in the same plane but may be located on a plane that is different from the plane of the flat area FA. The side areas SA may be bent from the flat area FA in the downward direction or in the third direction Z intersecting with the first direction X and the second direction Y in the drawings. Although the flat area FA and the side areas SA are shown to be substantially orthogonal to each other as illustrated in FIG. 20, the flat area FA and the side areas SA may have an acute angle or an obtuse angle therebetween. In addition, in some exemplary embodiments, the flat area FA may partially include a curved surface. In addition, the side areas SA may partially include a curved surface, or the entire side areas SA may include a curved surface.

The first subsidiary display area DA1 may be connected to the main display area DA0. Similarly, each of the second subsidiary display area DA2, the third subsidiary display area DA3, and the fourth subsidiary display area DA4 may be connected to the main display area DA0. In some exemplary embodiments, as shown in FIGS. 20 and 21, the first subsidiary display area DA1 may be located on the left side of the main display area DA0, the second subsidiary display area DA2 may be located on the right side of the main display area DA0, the third subsidiary display area DA3 may be located on the upper side of the main display area DA0, and the fourth subsidiary display area DA4 may be located on the lower side of the main display area DA0.

The non-display area NDA may include a first non-display area NDA1, a second non-display area NDA2, a third non-display area NDA3, and a fourth non-display area NDA4. In some exemplary embodiments, as shown in FIGS. 20 and 21, the first non-display area NDA1 may be located on the left side of the first subsidiary display area DA1 when viewed from the top. That is, the first non-display area NDA1 may be located on the opposite side of the main display area DA0 with the first subsidiary display area DA1 therebetween. The second non-display area NDA2 may be located on the right side of the second subsidiary display area DA2 when viewed from the top. That is, the second non-display area NDA2 may be disposed on the opposite side of the main display area DA0 with the second subsidiary display area DA2 therebetween. The third non-display area NDA3 may be located on the upper side of the third subsidiary display area DA3 when viewed from the top. That is, the third non-display area NDA3 may be located on the opposite side of the main display area DA0 with the third subsidiary display area DA3 therebetween. The fourth non-display area NDA4 may be located on the lower side of the fourth subsidiary display area DA4 when viewed from the top. That is, the fourth non-display area NDA4 may be located on the opposite side of the main display area DA0 with the fourth subsidiary display area DA4 therebetween. The fourth non-display area NDA4 may include a pad portion PP.

Although the pad portion PP is shown in FIG. 21 as being disposed only in the fourth non-display area NDA4, the present disclosure is not limited thereto. For example, the pad portion PP may be disposed in one of the first non-display area NDA1, the second non-display area NDA2, and the third non-display area NDA3, may be disposed in each of the fourth non-display area NDA4 and the third non-display area NDA3, may be disposed in each of the first non-display area NDA1 and the second non-display area NDA2, may be disposed in three of the first non-display area NDA1, the second non-display area NDA2, the third non-display area NDA3 and the fourth non-display area NDA4, or may be disposed in each of the first non-display area NDA1, the second non-display area NDA2, the third non-display area NDA3, and the fourth non-display area NDA4.

According to the exemplary embodiment of the present disclosure, the non-display area NDA may further include a fifth non-display area NDA5, a sixth non-display area NDA6, a seventh non-display area NDA7, and an eighth non-display area NDA8.

The fifth non-display area NDA5, the sixth non-display area NDA6, the seventh non-display area NDA7, and the eighth non-display area NDA8 may be positioned at the corners of the display device 10_8, respectively. The fifth non-display area NDA5 may be located between the first subsidiary display area DA1 and the third sub display area DA3 and/or between the first non-display area NDA1 and the third non-display area NDA3. The sixth non-display area NDA6 may be located between the second subsidiary display area DA2 and the third subsidiary display area DA3 and/or between the second non-display area NDA2 and the third non-display area NDA3. The seventh non-display area NDA7 may be located between the first subsidiary display area DA1 and the fourth subsidiary display area DA4 and/or between the first non-display area NDA1 and the fourth non-display area NDA4. The eighth non-display area NDA8 may be located between the second subsidiary display area DA2 and the fourth subsidiary display area DA4 and/or between the second non-display area NDA2 and the fourth non-display area NDA4.

The fifth non-display area NDA5, the sixth non-display area NDA6, the seventh non-display area NDA7, and the eighth non-display area NDA8 may be folded toward the inner side, i.e., toward an inner space or a center of gravity of the display device 10_8. In such case, the fifth non-display area NDA5, the sixth non-display area NDA6, the seventh non-display area NDA7, and the eighth non-display area NDA8 may be bent along respective ones of a plurality of bending lines CL, respectively.

At least one of the sides of the display device 10_8 may be bent. As shown in FIGS. 20 to 22, the display area DA of the display device 10_8 may be disposed in the flat area FA and some of the side areas SA, the contact portion CP may be disposed in at least one of the side areas SA, and the pad portion PP may be disposed in the subsidiary flat area SFA. The subsidiary flat area SFA may extend from the side areas SA in which the contact portion CP is disposed to face the flat area FA, and may be located in a plane different from that of the flat area FA.

Referring to FIGS. 22 and 23, the contact portion CP may be disposed in a portion of the fourth non-display area NDA4 that is adjacent to the fourth subsidiary display area DA4, and the pad portion PP may be disposed in another portion of the fourth non-display area NDA4.

In some exemplary embodiments, unlike that shown in FIGS. 22 and 23, the pad portion PP may be disposed on a portion of the side areas SA.

Although exemplary embodiments of the present disclosure have been disclosed for illustrative purposes, those skilled in the art will appreciate that various modifications, additions, and substitutions are possible, without departing from the scope and spirit of the present disclosure as disclosed in the accompanying claims.

What is claimed is:

1. A display device comprising:
a display area and a non-display area positioned around the display area, the non-display area comprising a pad portion and a contact portion that is disposed between the display area and the pad portion,
a first circuit portion comprising a demultiplexer disposed in the display area, a first connection electrode disposed in the pad portion, and a second connection electrode disposed in the contact portion; and
a second circuit portion disposed on a layer different from the first circuit portion and comprising a pixel disposed in the display area, a pad disposed in the pad portion, and a data line extending across the contact portion and the display area and electrically connected to the pixel, wherein the pad is electrically connected to the demultiplexer through the first connection electrode, and wherein the data line is electrically connected to the demultiplexer via the second connection electrode.

2. The display device of claim 1, further comprising: a first fan-out line connecting the first connection electrode and the demultiplexer; and a second fan-out line connecting the demultiplexer and the second connection electrode, wherein the first fan-out line extends across the pad portion, the contact portion, and the display area, and the second fan-out line extends across the display area and the contact portion.

3. The display device of claim 2, wherein the first connection electrode and the second connection electrode are disposed on a first same layer and comprise a first same material, and wherein the pad and the data line are disposed on a second same layer and comprise a second same material.

4. The display device of claim 3, wherein the first fan-out line and the second fan-out line are disposed on a same layer and comprise a same material, and wherein the same layer on which the first fan-out line and the second fan-out line are disposed is different from another layer on which the first connection electrode is disposed.

5. The display device of claim 4, wherein the pixel comprises a pixel transistor and a light-emitting element electrically connected to the pixel transistor, and wherein the demultiplexer comprises a demultiplexer transistor.

6. The display device of claim 5, wherein the pixel transistor comprises a pixel semiconductor layer, and the demultiplexer transistor comprises a demultiplexer semiconductor layer, and wherein the pixel semiconductor layer and the embedded circuit semiconductor layer comprise different materials.

7. The display device of claim 6, wherein one of the demultiplexer semiconductor layer and the pixel semiconductor layer comprises an oxide semiconductor, and the other of the demultiplexer semiconductor layer and the pixel semiconductor layer comprises a polysilicon.

8. The display device of claim 5, wherein the pixel transistor comprises a pixel semiconductor layer, a pixel gate electrode disposed on the pixel semiconductor layer, and a pixel source electrode and a pixel drain electrode disposed on the pixel gate electrode, and wherein the pixel source electrode and the pixel drain electrode are electrically connected to the pixel semiconductor layer, and the pixel source electrode and the pixel drain electrode are disposed on a same layer as the pad.

9. The display device of claim 8, wherein the demultiplexer transistor comprises a demultiplexer semiconductor layer, a demultiplexer gate electrode disposed on the demultiplexer semiconductor layer, and a demultiplexer source electrode and a demultiplexer drain electrode disposed on the demultiplexer gate electrode, and wherein the demultiplexer source electrode and the demultiplexer drain electrode are disposed on a same layer as the first connection electrode.

10. The display device of claim 1, wherein the second connection electrode is closer to the display area than the first connection electrode when viewed from top in a plan view.

11. The display device of claim 1, further comprising: an interlayer dielectric layer disposed between the first circuit portion and the second circuit portion.

12. The display device of claim 11, wherein the interlayer dielectric layer is in direct contact with the first connection electrode and the second connection electrode.

13. A display device comprising:
a display area and a non-display area positioned around the display area, the non-display area comprising a pad portion and a contact portion that is disposed between the display area and the pad portion,
a first circuit portion comprising a demultiplexer disposed in the display area, a first connection electrode disposed in the pad portion, and a second connection electrode disposed in the contact portion; and
a second circuit portion disposed on a layer different from the first circuit portion and comprising a pixel disposed in the display area, a pad disposed in the pad portion, and at least one data line extending across the contact portion and the display area and electrically connected to the pixel,
wherein the pad is electrically connected to the demultiplexer through the first connection electrode and provides a data signal to the demultiplexer,
wherein the at least one data line is electrically connected to the demultiplexer via the second connection electrode, and
wherein the demultiplexer generates divided data signals by dividing the data signal received from the pad using a time-division multiplexing.

14. The display device of claim 13, wherein the at least one data line comprises a first data line and a second data line that provide the divided data signals, respectively.

15. The display device of claim 14, wherein the second connection electrode comprises a first electrode portion connecting the demultiplexer and the first data line, and a second electrode portion connecting the demultiplexer and the second data line.

16. The display device of claim 15, further comprising: a first fan-out line connecting the first connection electrode and the demultiplexer; and a second fan-out line connecting the demultiplexer and the second connection electrode, wherein the first fan-out line extends across the pad portion, the contact portion, and the display area, and the second fan-out line extends across the display area and the contact portion.

17. The display device of claim 16, wherein the second fan-out line comprises a first line portion connecting the demultiplexer and the first electrode portion, and a second line portion connecting the demultiplexer and the second electrode portion.

18. The display device of claim 13, wherein the at least one data line extends in a first direction, and wherein the first circuit portion comprises a plurality of demultiplexers arranged along a second direction crossing the first direction.

19. The display device of claim 18, wherein same demux select signal lines are connected to the plurality of demultiplexers.

20. The display device of claim 13, wherein the at least one data line extends in a first direction and comprises a plurality of data lines arranged along a second direction crossing the first direction, wherein the first circuit portion comprises a plurality of demultiplexers comprising a first demultiplexer and a second demultiplexer, and wherein the first demultiplexer and the second demultiplexer are connected to different data lines of the at least one data line.

21. The display device of claim 20, wherein the first demultiplexer and the second demultiplexer are connected to different demux select signal lines.

22. The display device of claim 1, wherein the pixel overlaps the demultiplexer.

* * * * *